United States Patent
Rogers et al.

(10) Patent No.: US 10,794,777 B2
(45) Date of Patent: Oct. 6, 2020

(54) PASSIVE WIRELESS PRESSURE SENSOR FOR HARSH ENVIRONMENTS

(71) Applicant: University of Florida Research Foundation, Incorporated, Gainesville, FL (US)

(72) Inventors: John E. Rogers, Owens Cross Roads, AL (US); Mark Sheplak, Gainesville, FL (US); Yong Kyu Yoon, Gainesville, FL (US); Jack Judy, Gainesville, FL (US)

(73) Assignee: University of Florida Research Foundation, Incorporated, Gainesville, FL (US)

( * ) Notice: Subject to any disclaimer, the term of this patent is extended or adjusted under 35 U.S.C. 154(b) by 192 days.

(21) Appl. No.: 16/014,912

(22) Filed: Jun. 21, 2018

(65) Prior Publication Data

US 2018/0372563 A1   Dec. 27, 2018

Related U.S. Application Data

(60) Provisional application No. 62/522,830, filed on Jun. 21, 2017.

(51) Int. Cl.
*G01L 1/14* (2006.01)
*G01L 9/00* (2006.01)
(Continued)

(52) U.S. Cl.
CPC ............ *G01L 1/148* (2013.01); *B81B 3/0021* (2013.01); *B81B 7/02* (2013.01); *G01L 9/0042* (2013.01);
(Continued)

(58) Field of Classification Search
CPC ..... G01L 1/148; G01L 9/0042; G01L 9/0077; G01L 9/0073; B81B 3/0021; B81B 7/02; H01Q 1/002; H01Q 9/0428; H01Q 13/106
(Continued)

(56) References Cited

U.S. PATENT DOCUMENTS 7,444,878 B1 *   11/2008  Pepples  ................... G01L 9/007
73/722

FOREIGN PATENT DOCUMENTS

WO    WO-2018197128 A1 *  11/2018  ........... G01L 9/0072

OTHER PUBLICATIONS

English translation of Mayer (WO2018197128) description, accessed from patentscope.wipo.int Mar. 31, 2020.*
(Continued)

*Primary Examiner* — Nimeshkumar D Patel
*Assistant Examiner* — Jean F Morello
(74) *Attorney, Agent, or Firm* — Alston & Bird LLP

(57) ABSTRACT

Methods and apparatuses for measuring static and dynamic pressures in harsh environments are disclosed. A pressure sensor according to one embodiment of the present invention may include a diaphragm constructed from materials designed to operate in harsh environments. A waveguide may be operably connected to the diaphragm, and an electromagnetic wave producing and receiving (e.g., sensing) device may be attached to the waveguide, opposite the diaphragm. A handle may be connected between the diaphragm and the waveguide to provide both structural support and electrical functionality for the sensor. A gap may be included between the handle and the diaphragm, allowing the diaphragm to move freely. An antenna and a ground plane may be formed on the diaphragm or the handle. Electromagnetic waves may be reflected off the antenna and
(Continued)

detected to directly measure static and dynamic pressures applied to the diaphragm.

21 Claims, 15 Drawing Sheets

(51) Int. Cl.
*H01Q 13/10* (2006.01)
*B81B 3/00* (2006.01)
*H01Q 1/00* (2006.01)
*H01Q 1/22* (2006.01)
*H01Q 9/04* (2006.01)
*B81B 7/02* (2006.01)

(52) U.S. Cl.
CPC .......... *G01L 9/0047* (2013.01); *G01L 9/0073* (2013.01); *G01L 9/0077* (2013.01); *H01Q 1/002* (2013.01); *H01Q 1/2208* (2013.01); *H01Q 9/0428* (2013.01); *H01Q 13/106* (2013.01); *B81B 2201/0264* (2013.01); *B81C 2201/0143* (2013.01)

(58) Field of Classification Search
USPC .......................... 73/718, 722, 756; 340/870
See application file for complete search history.

(56) References Cited

OTHER PUBLICATIONS

English translation of Mayer (WO2018197128) claims, accessed from patentscope.wipo.int Mar. 31, 2020.*

* cited by examiner

PASSIVE WIRELESS PRESSURE SENSOR FOR HARSH ENVIRONMENTS

CROSS-REFERENCE TO RELATED APPLICATIONS

This patent application claims priority to Provisional Application Ser. No. 62/522,830, filed Jun. 21, 2017 which is incorporated herein by reference in its entirety.

GOVERNMENT SUPPORT

This invention was made with government support under Grant No. DE-FE0012370 awarded by Department of Energy. The government has certain rights in the invention.

BACKGROUND

A sensor capable of operating in a harsh environment may be exposed to high temperatures, vibrations, ionizing radiation, and/or chemical exposure. A high-temperature gas turbine is one example of a harsh environment. The measurement of temperature, pressure, fuel flow, and rotor speed is vital in assessing or monitoring the state of high-temperature gas turbines. High cycle fatigue (HCF), caused by pressure fluctuations in the air flow across the turbine blades and vanes, is the primary source of component failure in gas turbines. The ability to locally measure pressure fluctuations can provide insight to significantly reduce HCF. For this application, as well as others, there is a need for sensors that can survive in such a harsh environment yet provide accurate measurements.

BRIEF SUMMARY

Embodiments of the present invention include methods and apparatuses for measuring static and dynamic pressure in harsh environments. In certain embodiments, the sensors take the form of a passive wireless microelectromechanical system (MEMS) capacitive-type pressure sensor that operates using radio frequency electromagnetic radiation.

In one embodiment, the method includes providing a microelectromechanical system (MEMS) sensor with a diaphragm, which deflects either downward or upward in response to a corresponding applied pressure difference across the diaphragm. Furthermore, a conductive ground plane under the diaphragm and a conductive antenna under the ground plane form a capacitive element. An incident electromagnetic wave interacts with the antenna under the ground plane on the MEMS sensor in such a way that a portion of the incident electromagnetic wave is reflected back providing information about the deflection of the diaphragm and hence the applied pressure to the MEMS sensor. Methods of embodiments of the present invention can be used for static (e.g., time invariant) or dynamic (e.g., varies with time) measurements of pressure.

The MEMS sensor can include a structurally rigid handle that is attached to the diaphragm in the periphery of an air cavity separating the handle from the diaphragm. Furthermore, a ground plane may be formed under the diaphragm, and an antenna may be formed under the handle. The placement of the antenna and ground plane may vary in location such as to provide a desired capacitance change for pressure measurement. The air gap between the handle and diaphragm allows the diaphragm to displace by an applied pressure yielding a change in capacitance. A vent channel and hole may be formed for dynamic pressure measurement, while the vent channel and/or hole may be excluded for static pressure measurement. The pressure applied to the MEMS sensor is determined based on magnitude and/or phase characteristics of the reflected electromagnetic waves. The sensor is designed to have a corresponding electrical resonant frequency such that as the diaphragm deflects in response to an applied pressure, the electrical resonant frequency shifts, which results in direct measurement of the applied pressure. Sensors according to certain embodiments of the present invention can be applied in applications such as high-temperature gas turbines, where conventional sensors are unable to operate.

In another embodiment, a passive wireless pressure sensor may be constructed of materials designed to operate in harsh environments. A handle and a diaphragm, for example, can be formed with sapphire. The ground plane and antenna elements, on the other hand, can be formed with platinum. It is desirable to have sufficient electrical isolation between the ground plane and antenna elements so that they behave like a capacitor. Furthermore, the material chosen for the handle and diaphragm should have electrical isolation across the desired operating temperature range of the MEMS sensor. Sapphire has a high melting temperature of 2030° C. and is known to have excellent electrical, mechanical, and optical properties. Platinum has a high melting temperature of 1768° C. and has a low power-law creep with sapphire.

A waveguide can be provided to guide the electromagnetic waves to and from the MEMS sensor. The transmitter and receiver electronics are located on the frontend of the electromagnetic waveguide, while the sensor is placed at the backend of the electromagnetic waveguide. The electromagnetic waveguide also makes it physically realizable for interaction with the sensor while in a high-temperature gas turbine due to the fact that electromagnetic waves are unable to penetrate through conductive walls. The electromagnetic waveguide should also be constructed of high-temperature compatible materials. The electromagnetic waves are in the radio frequency range of interest. The electromagnetic waveguide allows the transmitter and receiver electronics to interact with the passive wireless pressure sensor.

Sensors of certain embodiments of the present invention may be passive (e.g., no internal energy sources such as batteries are required) and wireless (e.g., no wires are directly attached to the MEMS sensor). The sensor can also be constructed of high temperature compatible materials, such as sapphire for the handle and diaphragm and platinum for the ground plane and antenna elements. The antenna can be a planar type such as a patch antenna. Furthermore, the antenna element can include a slot or some other defect in the antenna or ground plane for introducing circular polarization to the antenna element. The antenna may use circular polarization for providing increased contrast between the MEMS sensor and any existing background.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

DETAILED DESCRIPTION OF VARIOUS EMBODIMENTS OF THE INVENTION

Embodiments of the present invention include methods, apparatuses, and theory for measuring static and dynamic pressure in harsh environments. This is described further in the publication by J. E. Rogers, Y.-K. Yoon, M. Sheplak, and J. W. Judy, "A Passive Wireless Microelectromechanical Pressure Sensor for Harsh Environments," Journal of Microelectromechanical Systems, vol. 27, no. 1, February 2018, which is hereby incorporated by reference in its entirety. Certain embodiments can take the form of a microelectromechanical system (MEMS) capacitive-type passive wireless pressure sensor that operates using radio frequency electromagnetic radiation.

Pressure sensors of certain embodiments of the present invention can be both passive (e.g., no local internal energy sources) and wireless (e.g., no wired local interface electronics). The passive wireless sensor can electrically operate, for example, at Ku-band frequencies around 15 GHz (e.g., 2 cm wavelength in free-space). The passive wireless sensor can operate in the far-field, as opposed to existing pressure sensors that are inductively coupled in the near-field. The separation distance between the transmitter/receiver and the MEMS sensor in the inductively coupled near-field affects the sensor's behavior, while in the far-field this is not the case.

The passive wireless dynamic pressure sensor transduces acoustic fluctuations (e.g., dynamic pressure) into mechanical vibrations of a diaphragm. The mechanical vibrations are further transduced to a frequency shift of an electrical resonator. The pressure sensor can reside at the backend of an electromagnetic waveguide for sensor interaction. An electromagnetic wave (preferably with power at some Ku-band frequency in the vicinity of 15 GHz) is transmitted from the frontend of the electromagnetic waveguide to the backend where it interacts with the sensor. The power loss through the waveguide is related to the length and attenuation of the electromagnetic waveguide at the desired operating frequency. Using these techniques, embodiments of the present invention can take static or dynamic pressure measurements both passively and wirelessly.

I. Exemplary Sensor Structure and Construction

Figure 1:
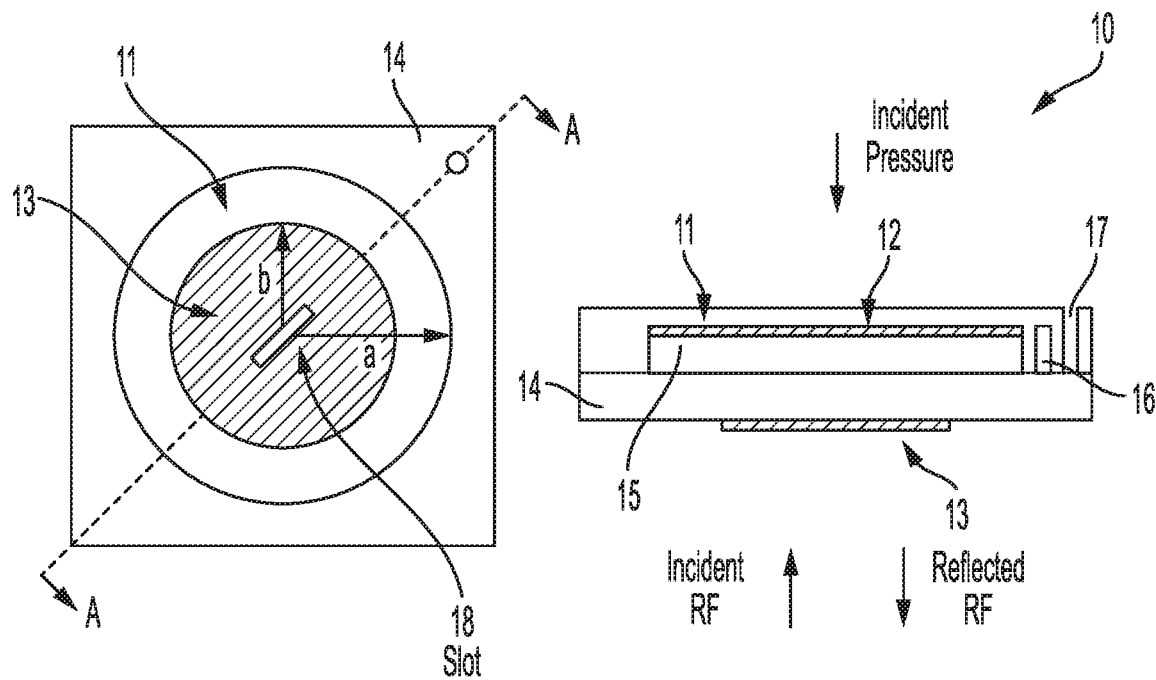
FIG. 1 shows bottom and cross-sectional views of a passive wireless dynamic pressure sensor according to an embodiment of the present invention.

Passive wireless pressure sensors of certain embodiments of the present invention can be designed to operate at temperatures in excess of 1000° C. The sensors can operate in the far-field at Ku-band frequencies around 15 GHz. A passive wireless dynamic pressure sensor 10 of certain embodiments of the present invention can include a reflective patch antenna 13 with a slot 18 under a circular diaphragm 11, as shown in FIG. 1. An air gap 15 is shown separating the electrical ground plane 12 from the patch antenna 13 to form a variable capacitive element. A handle 14 can also be provided as an acoustic hard boundary for the backside of the air gap 15, while simultaneously providing a dielectric medium between the reflective patch antenna 13 and electrical ground plane 12. The reflective patch antenna 13 can be formed on the backside of the sensor's handle 14. A vent channel 16 and vent hole 17 adjoining the air gap 15 can also be provided for the purpose of rejecting static pressure for dynamic pressure sensing. The vent channel and vent hole reject static pressure by blocking the air path from the air gap to the outer environment. The length, width, and depth of the vent channel determine the frequency where the diaphragm of the pressure sensor will "begin" to deflect. The longer the vent channel, the narrower the width and depth, the lower the frequency where the diaphragm begins to deflect. The necessary frequency is determined by the application. Alternatively, the vent hole and/or vent channel can be removed to produce a static pressure sensor.

The diaphragm 11 of the passive wireless dynamic pressure sensor is designed to deflect in response to an applied pressure. The patch antenna 13 and the ground plane 12 have the air gap 15, which forms a capacitor. There is also an inductance associated with the antenna 13 and the ground plane 12 such that the pressure sensor has a nominal (e.g., no deflection) electrical resonant frequency. The electrical resonant frequency changes as a function of the capacitance change of the pressure sensor. An increase in the applied pressure to the diaphragm, for example, increases the capacitance and decreases the electrical resonant frequency. The change in the electrical resonant frequency is directly related to the applied pressure by the equivalent sensitivity of the pressure sensor.

An incident electromagnetic wave (e.g., incident RF) from a transmitter interacts with the patch antenna 13 and capacitive element such that a portion of the incident electromagnetic wave is reflected or backscattered (e.g., reflected RF) to a receiver. Note that the transmitter that transmits the incident electromagnetic wave and the receiver that receives the reflected electromagnetic wave are not shown in FIG. 1. The transmitter and receiver may be any conventional transmitter and receiver.

The strength of the reflected electromagnetic wave is a function of the capacitive gap 15 as well as the physical area of the antenna 13. The relationship is illustrated in more details in the Sensor Modeling and Analysis section below. The wireless sensing of certain embodiments of the present invention can be considered a combination of RF backscattering and radar.

Figure 2:
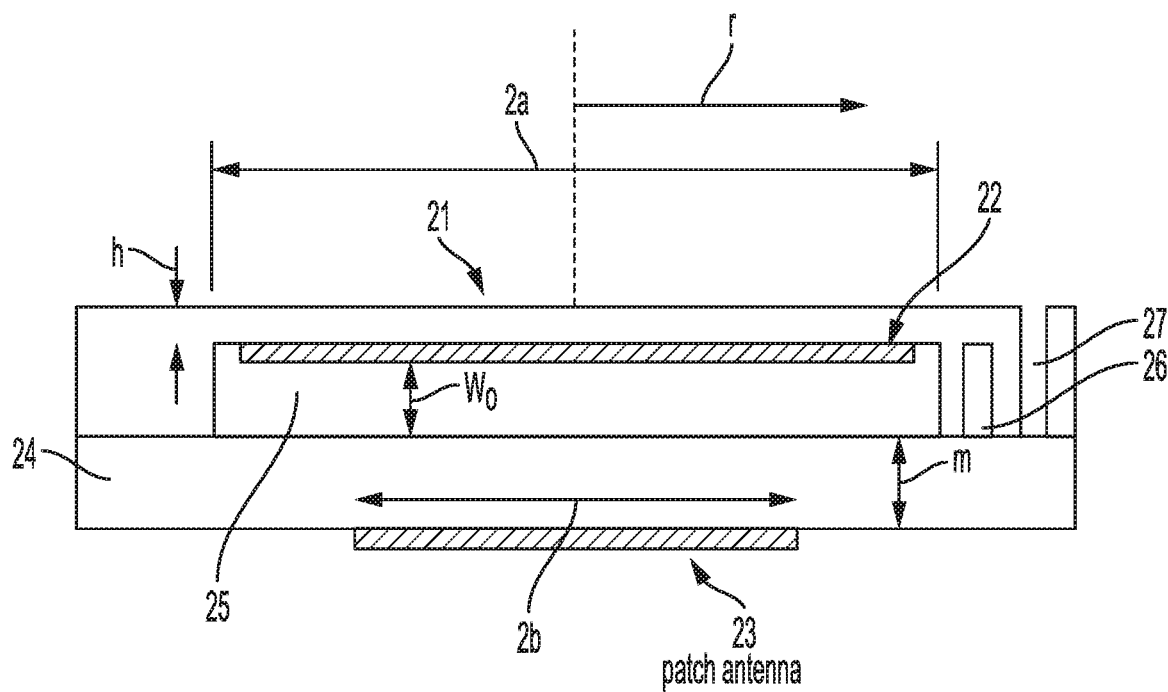
FIG. 2 shows a cross-sectional view of an unloaded passive wireless dynamic pressure sensor according to an embodiment of the present invention.

A passive wireless dynamic pressure sensor can include a deformable diaphragm 21 with an electrically conductive ground plane 22 under the diaphragm 21, as shown in FIG. 2. An air gap or cavity 25 can be provided below the ground plane 22 for allowing deflection of the diaphragm 21. A handle 24 can be provided as an acoustic hard boundary for the backside of the cavity 25, while simultaneously providing a dielectric medium between the slot antenna 23 and ground plane 22. An electrically conductive slot antenna 23 can be formed on the backside of the sensor's handle 24. A vent channel 26 and vent hole 27 adjoining the cavity 25 can also be formed for the purpose of rejecting static pressure for dynamic pressure sensing. The vent channel and vent hole reject static pressure by blocking the air path from the air gap to the outer environment. The length, width, and depth of the vent channel determine the frequency where the diaphragm of the pressure sensor will "begin" to deflect. The longer the vent channel, the narrower the width and depth, the lower the frequency where the diaphragm begins to deflect. The necessary frequency is determined by the application. For example, dynamic pressure sensors of certain embodiments of the present invention can be designed to measure frequencies ranging from 20 Hz to 100 kHz. The lower frequency 20 Hz can be achieved by designing proper length, width, and depth of the vent channel. The higher frequency (100 kHz), on the other hand, is determined by the resonant frequency of the diaphragm. Alternatively, the vent hole and/or vent channel can be removed to produce a static pressure sensor.

Figure 3:
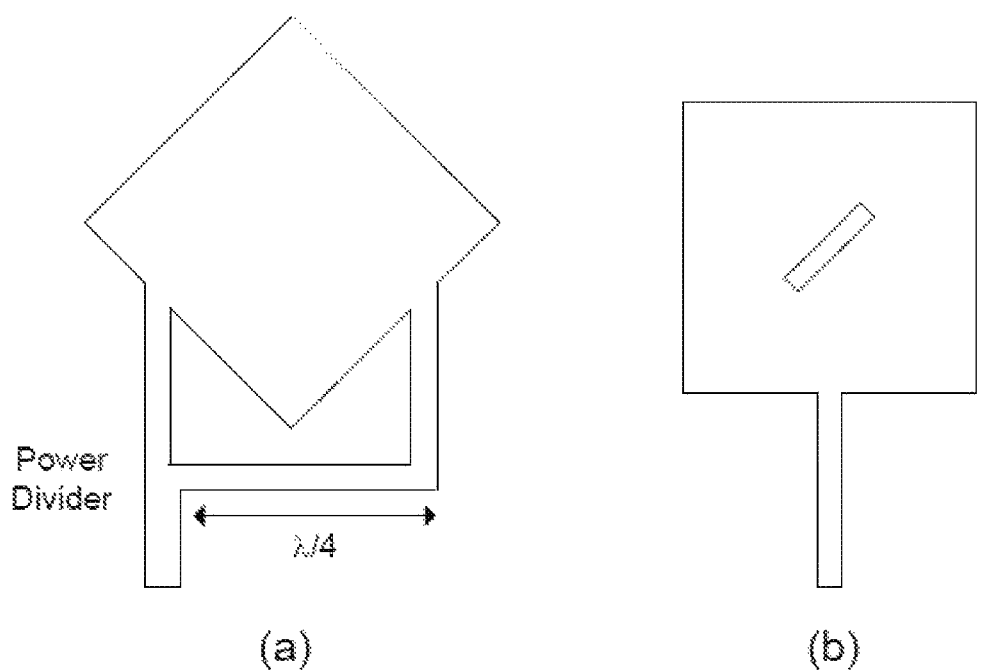
FIG. 3 shows a diagram of (a) a microstrip fed square patch antenna with power divider and (b) a microstrip fed square patch antenna with slot.

The patch antenna of certain embodiments of the present invention can be circularly polarized. Patch antennas are inherently linearly polarized, however they can be made to be circularly polarized by a few techniques, such as that shown in FIG. 3. The patch antenna in FIG. 3(a) obtains circular polarization by feeding the antenna from two sides with one side being fed with a signal 90 deg out of phase with the other. The patch antenna in FIG. 3(b) obtains circular polarization by utilizing a slot cut out of the center of the patch antenna. Both of these techniques are sufficient when applying a signal to the patch using a microstrip feed, however, the patch antenna in FIG. 3(b) is much simpler to implement when looking at reflected waves hitting the patch in the far field due to an incident wave.

Figure 4:
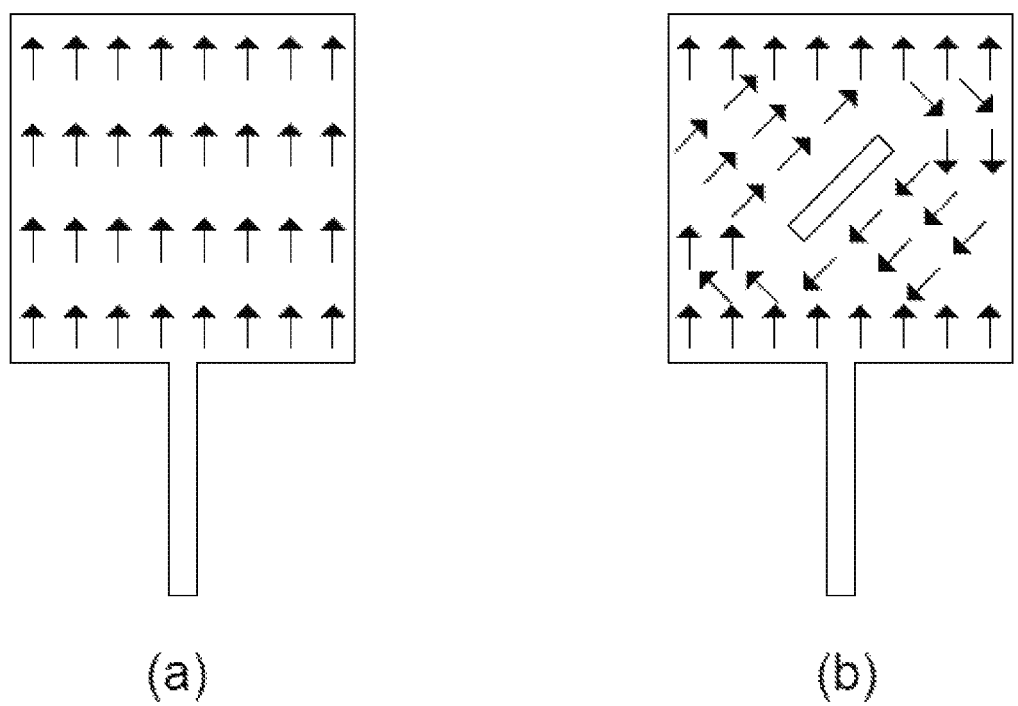
FIG. 4 illustrates current distribution of (a) a patch antenna and (b) a patch antenna with a slot.

FIG. 4 shows the electrical current flow along the square patch antenna without a slot (FIG. 4(a)) and with a slot (FIG. 4(b)). The visualization shows that without the slot the electrical current along the patch antenna is flowing linearly, whereas with the slot the current is forced to flow in a circular fashion.

Figure 5:
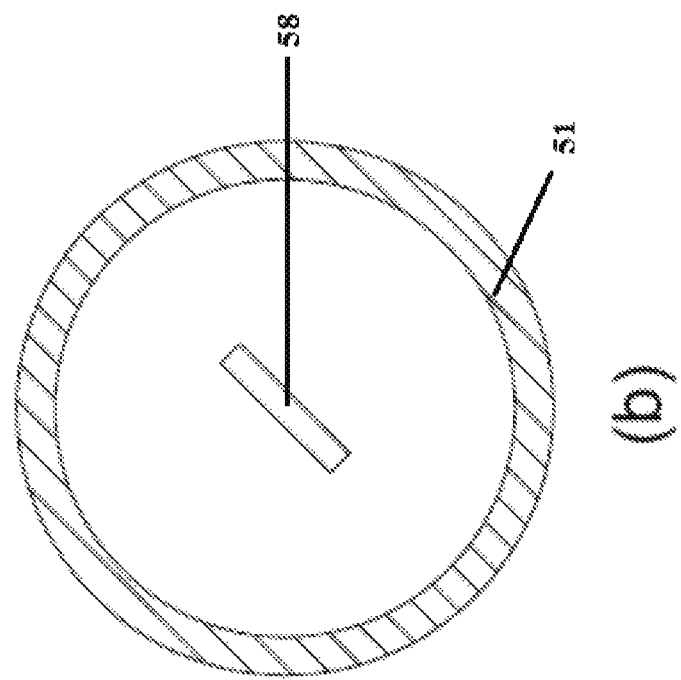
FIG. 5 illustrates examples of (a) rectangular and (b) circular patch antennas encompassed by circular diaphragms.
Figure 5:
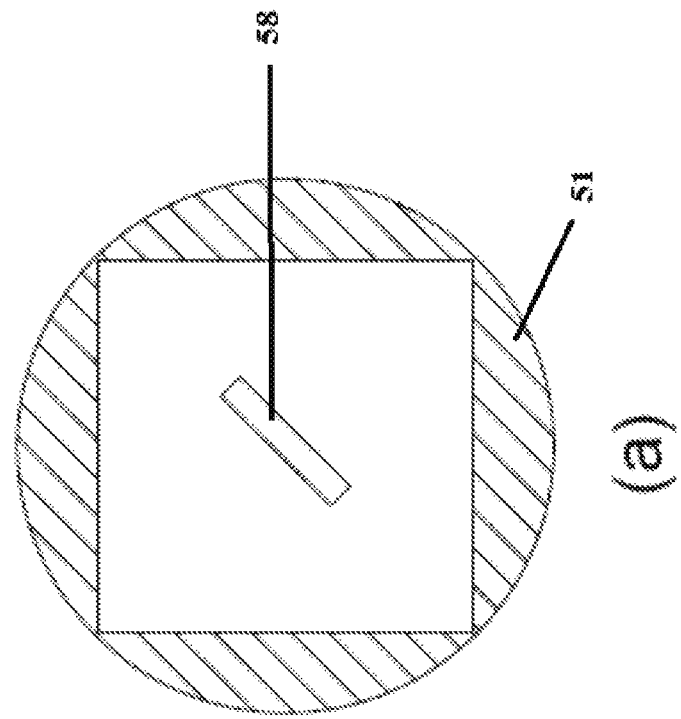

FIG. 5 shows two exemplary implementations of patch antennas under a circular diaphragm 51. Each of the two patch antennas under the circular diaphragm 51 has a slot 58. FIG. 5(a) has a square or rectangular patch antenna (with the slot), and FIG. 5(b) has a circular patch antenna (with the slot). The implementation using the circular patch antenna can provide the highest "fill factor" (or the highest area to perimeter ratio). Moreover, the circular patch antenna provides better circular polarization than the square/rectangular patch antenna due to RF electrical current wanting to migrate or collect in the corners of the square/rectangle.

Figure 6:
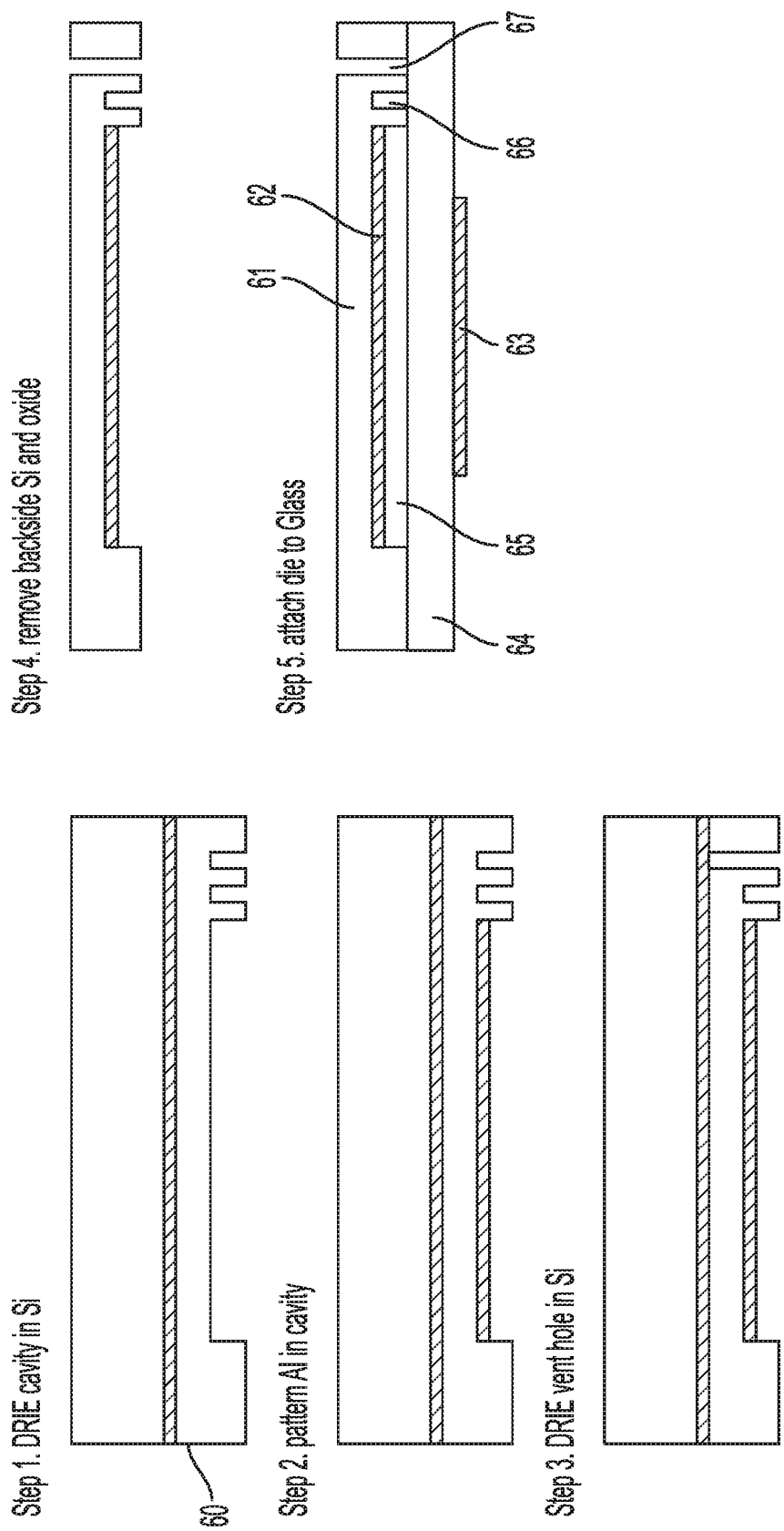
FIG. 6 shows a method of fabricating a dynamic pressure sensor according to an embodiment of the present invention.

FIG. 6 shows a method of fabricating a dynamic pressure sensor according to an embodiment of the present invention. In Step 1, deep reactive ion etching (DRIE) is used to form an air gap or cavity 65 and vent channel 66 in a silicon on insulator (SOI) wafer 60. In Step 2, aluminum is deposited and patterned in the cavity 65 to form the electrical ground plane 62. In Step 3, a vent hole 67 is then formed using DRIE. In Step 4, the backside silicon and oxide are removed using DRIE and plasma etching, respectively. In Step 5, the diaphragm 61 with electrical ground plane 62 is bonded to a handle 64 with a patterned aluminum slot antenna 63.

Figure 7:
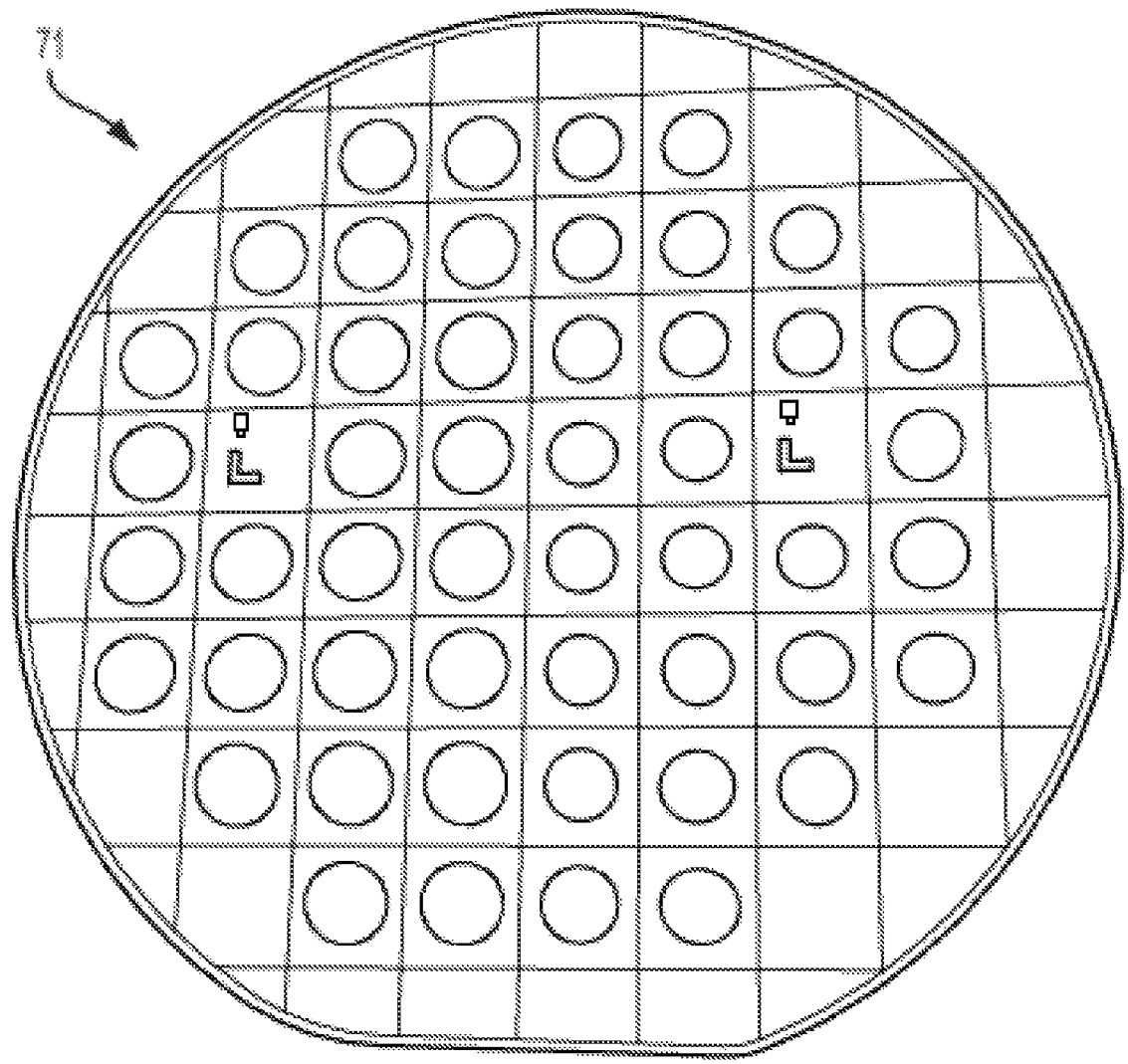
FIG. 7 shows a fabricated silicon on insulator (SOI) wafer with an aluminum deposited cavity and vent hole.

FIG. 7 shows a fabricated SOI wafer 71 after aluminum deposition/patterning in the cavity and vent hole formation. The SOI wafer in FIG. 7 contains multiple dies, and each die includes part of a dynamic pressure sensor after going through the fabrication Steps 1-3 in FIG. 6.

Figure 8:
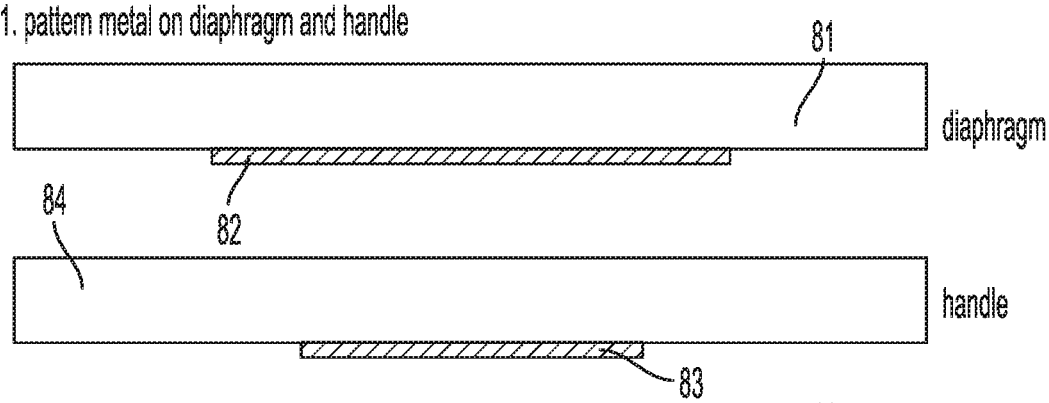
FIG. 8 shows a fabrication process for a high-temperature dynamic pressure sensor according to an embodiment of the present invention.
Figure 8:
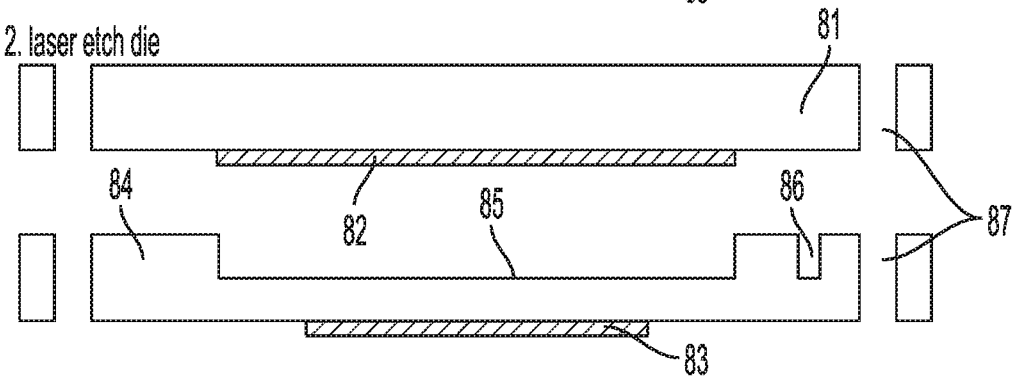
Figure 8:
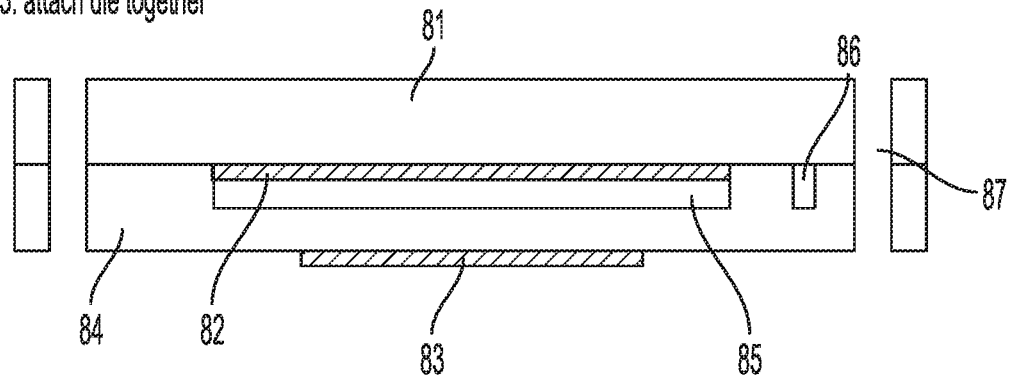

FIG. 8 shows a fabrication process for a high-temperature dynamic pressure sensor according to an embodiment of the present invention. In Step 1, an electrical ground plane 82 is formed by depositing and patterning a high-temperature compatible metal on the diaphragm 81. Similarly, in Step 1, a slot antenna 83 is formed by depositing and patterning a high-temperature compatible metal on the handle 84. In Step 2, a laser machine is then used to form an air gap or cavity 85, a vent channel 86, and a vent hole 87 in the diaphragm 81 and handle 84. Furthermore, thru holes may be laser machined for bonding purposes around the periphery of the diaphragm 81 and handle 84. In Step 3, the handle 84 with antenna 83 is then bonded to the diaphragm 81 with ground plane 82.

From a material construction standpoint, high-temperature dynamic pressure sensors of certain embodiments of the present invention can include a sapphire-based diaphragm with handle and a platinum-based slot antenna with ground plane. Sapphire has a high melting temperature of 2030° C. and is known to have excellent electrical, mechanical, and optical properties. Platinum has a high melting temperature of 1768° C. and has a low power-law creep with sapphire. Laser machining of sapphire can be cost prohibitive as well as time consuming. The addition of an inner layer between the two sapphire dies can functionally serve to create an air gap and vent channel. A high-temperature compatible metal such as titanium can be deposited at a controlled rate to form the inner layer and for precise definition of the air gap. The low resistivity of the metal does not interfere with the electrical performance of the sensor as the high resistivity of the sapphire electrically isolates the antenna and ground plane.

Figure 9:
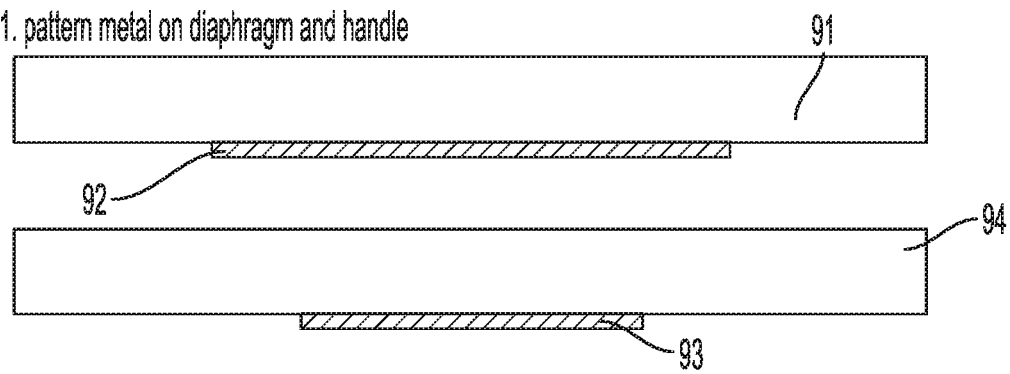
FIG. 9 shows a fabrication process for a high-temperature dynamic pressure sensor according to an embodiment of the present invention.
Figure 9:
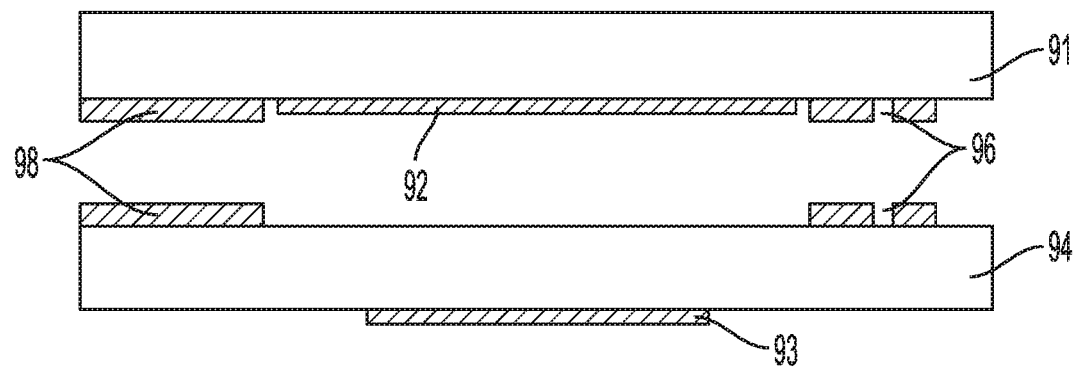
Figure 9:
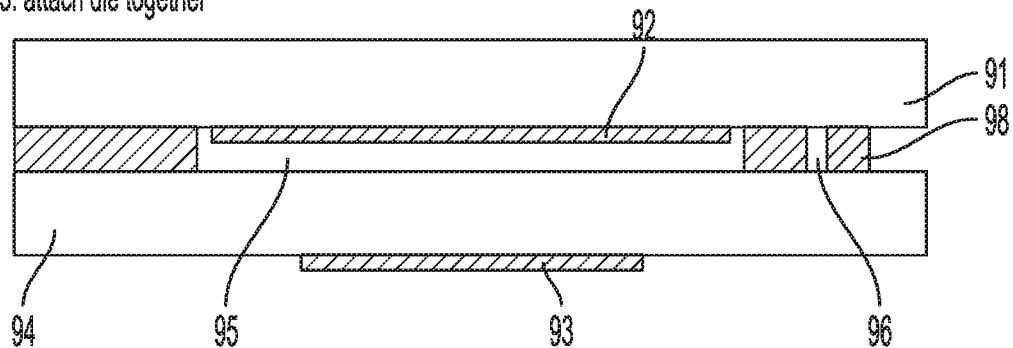

FIG. 9 shows a fabrication process for a high-temperature dynamic pressure sensor according to an embodiment of the present invention. In Step 1, an electrical ground plane 92 is formed by depositing and patterning a high-temperature compatible metal on the diaphragm 91. Similarly, in Step 1, a slot antenna 93 is formed by depositing and patterning a high-temperature compatible metal on the handle 94. In Step 2, an inner layer or a spacer layer 98 is formed between the diaphragm 91 and the handle 94. In Step 3, a vent channel 96 and an air gap or cavity 95 are formed within the spacer layer 98 after bonding the space layer formed on the diaphragm 91 and the handle 94.

Figure 10:
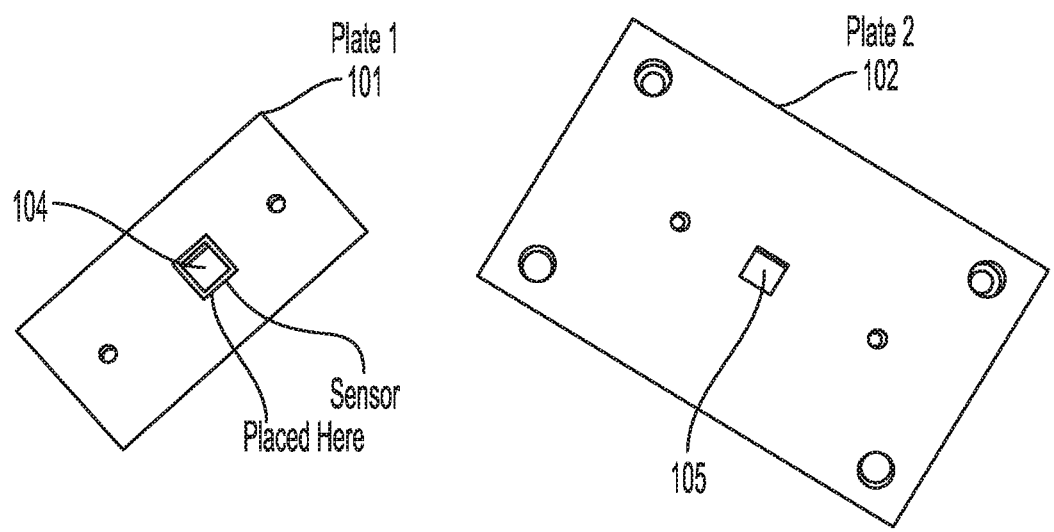
FIG. 10 is an image of prototype aluminum plates for mounting a high-temperature dynamic pressure sensor according to an embodiment of the present invention.

The packaging of the passive wireless dynamic pressure sensor can consist of two conductive plates 101 and 102 in FIG. 10. FIG. 10 is an image of prototype plates for mounting a dynamic pressure sensor according to an embodiment of the present invention. The conductive plates can be fabricated with aluminum. The plates can be used for both securing the sensor for minimizing acoustic losses as well as interacting with electromagnetic waves. Viewing FIG. 1, the passive wireless dynamic pressure sensor 10 can include the diaphragm 11, ground plane 12, antenna 13, handle 14, air gap or cavity 15, vent channel 16, and vent hole 17. The sensor 10 can be securely placed between the two plates 101 and 102, with a recess formed in one or both of the plates to accommodate the sensor. In one embodiment, the plate 101 can have a recess 103 for allowing the sensor 10 to sit flush with the surface of the plate 101 and also have a first opening 104 incorporated in the recess 103 to expose the antenna 13 to an electromagnetic waveguide. The plate 102 can have a second opening 105 with an area smaller than the sensor 10 for securing the sensor in place and exposing the diaphragm to the pressure measurement environment. The first opening 104 allows the diaphragm of the sensor 10 to interact with the high-temperature environment where static and/or dynamic pressure are present. The second opening 105 allows the antenna 13 of the sensor 10 to interact with the electromagnetic waveguide.

An electromagnetic waveguide with two channels can be designed to interact with the dynamic pressure sensor. The two channels can be two perpendicular rectangular channels constructed side by side for transmitting electromagnetic waves in one direction and receiving electromagnetic waves in a perpendicular direction. The receive electromagnetic waveguide is perpendicular to the transmit such that there is minimal unwanted signal transmission from the transmitter to the receiver. The passive wireless pressure sensor may be circularly polarized to reflect a portion of the transmitted electromagnetic waves through the receive electromagnetic waveguide.

Figure 11:
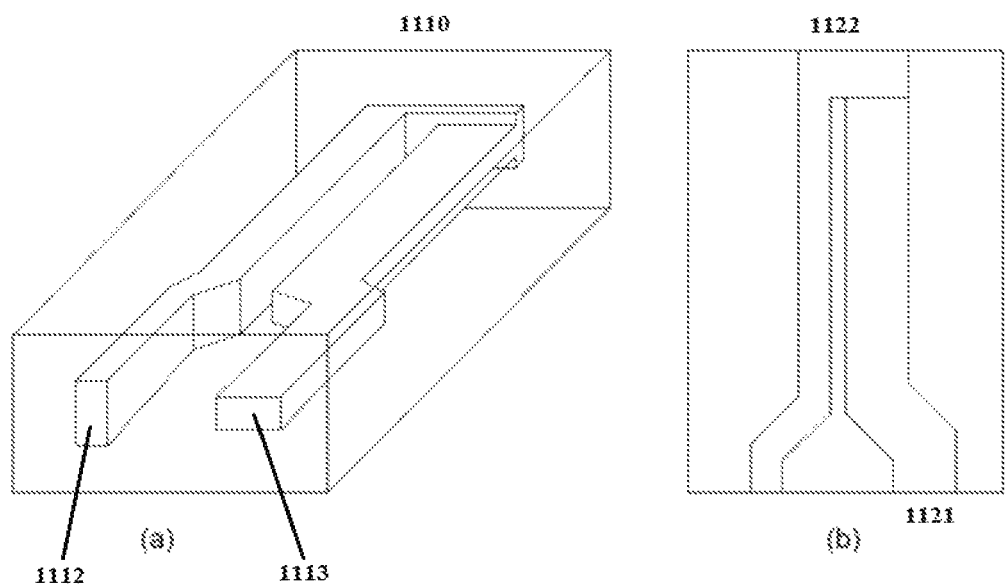
FIG. 11 shows an illustration of (a) a two channel electromagnetic waveguide and (b) its cross-sectional view according to an embodiment of the present invention.

An exemplary electromagnetic waveguide 1110 is pictured in FIG. 11. The waveguide as illustrated and in certain embodiments includes a first channel 1112 and a second channel 1113 for incident and reflected electromagnetic waves. The MEMS sensor can be placed at the back end 1122 of the waveguide 1110, while an electromagnetic radiation transmitter and receiver can reside at the front end 1121 of the waveguide. The electromagnetic waves may be in the radio frequency range of interest (e.g., from 1 to 100 GHz and more preferably from 10 to 20 GHz). For example, the two channels may have cross-sectional dimensions of 15.8 mm×7.9 mm for operating at Ku-band frequencies. The electromagnetic waveguide allows the transmitter and receiver electronics to interact with the passive wireless dynamic pressure sensor.

Figure 12:
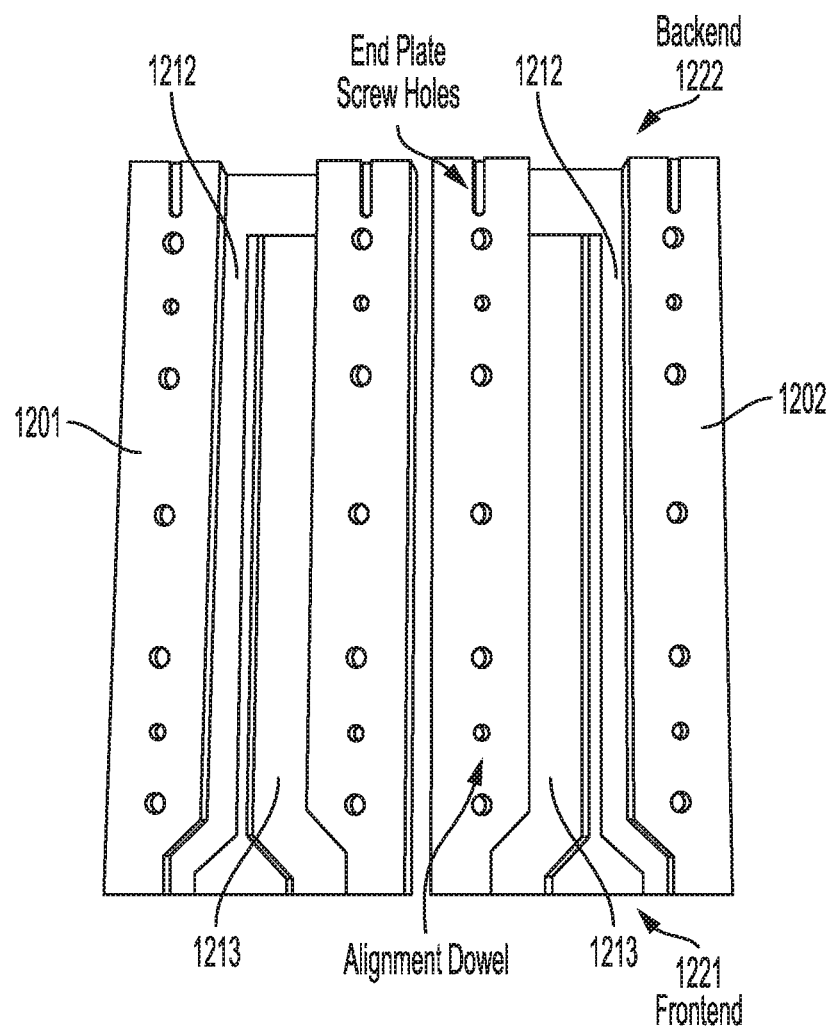
FIG. 12 shows an image of a fabricated aluminum electromagnetic waveguide for a passive wireless dynamic pressure sensor according to an embodiment of the present invention.

FIG. 12 shows an image of a prototype waveguide according to an embodiment of the present invention. For ease of manufacturing, the electromagnetic waveguide is constructed of two mirrored sections 1201 and 1202. When the two sections are assembled together, two channels 1212 and 1213 can be formed. The two channels may have cross-sectional dimensions of 15.8 mm×7.9 mm for operating at Ku-band frequencies. The front end 1221 of the electromagnetic waveguide is designed to be compatible with WR-62 coax-to-waveguide adapters. The back end 1222 of the electromagnetic waveguide has an opening for interfacing with a sensor placed between the two conductive plates in FIG. 10.

The subject invention includes, but is not limited to, the following exemplified embodiments.

Embodiment 1

A static or dynamic pressure sensor for harsh environments comprising: a diaphragm; a waveguide operably connected to the diaphragm; and an electromagnetic wave producing and receiving (e.g., sensing) device attached to the waveguide (opposite the diaphragm).

Embodiment 2

The sensor of Embodiment 1, further comprising a handle connected between the diaphragm and the waveguide.

Embodiment 3

The sensor of any of Embodiments 1 to 2, wherein the waveguide transmits radio frequency waves.

Embodiment 4

The sensor of any of Embodiments 1 to 3, wherein the electromagnetic wave producing and receiving device produces and receives radio frequency waves (e.g., from 1 to 100 GHz and more preferably from 10 to 20 GHz).

Embodiment 5

The sensor of any of Embodiments 1 to 4, further comprising a ground plane formed on either the diaphragm or the handle.

Embodiment 6

The sensor of any of Embodiments 1 to 5, further comprising an antenna formed on either the handle or the diaphragm.

Embodiment 7

The sensor of any of Embodiments 1 to 6, further comprising a dielectric gap between the diaphragm and the handle (e.g., filled with air, or a gas or liquid).

Embodiment 8

The sensor of any of Embodiments 1 to 7, wherein the antenna is a planar antenna (e.g., patch antenna) with or without a defect in the antenna or ground plane (e.g., slot).

Embodiment 9

The sensor of any of Embodiments 1 to 8, wherein the ground plane and/or antenna are comprised of a high-temperature compatible electrically conductive material (e.g., platinum). The ground plane and/or antenna may also be comprised of one or more of the following materials: titanium, chromium, iridium, tungsten, etc.

Embodiment 10

The sensor of any of Embodiments 1 to 9, wherein the sensor is suitable for operating in an acoustic frequency ranging from 20 Hz to 100 kHz.

Embodiment 11

The sensor of any of Embodiments 1 to 10, wherein the diaphragm and/or handle are comprised of a high-temperature compatible material (e.g., sapphire). The diaphragm may also be one or more of the following materials: aluminum nitride, silicon carbide, silicon nitride, diamond, etc.

Embodiment 12

The sensor of any of Embodiments 1 to 11, wherein waveguide is comprised of a high-temperature compatible electrically conductive material.

Embodiment 13

The sensor of any of Embodiments 1 to 12, further comprising a vent structure that acoustically connects the dielectric gap with the outside environment. The vent structure, for example, may be a serpentine vent.

Embodiment 14

The sensor of any of Embodiments 1 to 13, further comprising one or more plates for securing the sensor to the waveguide. Two plates, for example, one or both with a recess to accommodate the sensor for simultaneously interacting with a high-temperature environment and an electromagnetic waveguide.

Embodiment 15

The sensor of any of Embodiments 1 to 14, wherein the diameter of the antenna is between 0.5 and 20 mm and more preferably between 2 and 8 mm.

Embodiment 16

The sensor of any of Embodiments 1 to 15, wherein the diameter of the diaphragm is between 0.5 and 20 mm and more preferably between 2 and 8 mm.

Embodiment 17

The sensor of any of Embodiments 1 to 16, wherein the sensor utilizes a combination of RF backscattering and radar to measure diaphragm displacement.

Embodiment 101

A method for taking pressure measurements in harsh environments comprising: providing a microelectromechanical system (MEMS) including a diaphragm; transmitting electromagnetic waves toward the MEMS; receiving the electromagnetic waves as they are reflected off the MEMS; and determining diaphragm position or pressure applied to the diaphragm using measurements obtained from the reflected waves. The diaphragm position or the applied pressure can be determined based at least on the calibration of the MEMS device.

Embodiment 102

The method of Embodiment 101, further comprising providing a waveguide to channel or guide the electromagnetic waves.

Embodiment 103

The method of any of Embodiments 101 to 102, wherein the electromagnetic waves are radio frequency waves.

Embodiment 104

The method of any of Embodiments 101 to 103, wherein the MEMS further includes a handle that is bonded to the diaphragm.

Embodiment 105

The method of any of Embodiments 101 to 104, wherein the MEMS further includes a ground plane which may be formed on either the diaphragm or the handle.

Embodiment 106

The method of any of Embodiments 101 to 105, wherein the MEMS further includes an antenna which may be formed on either the handle or diaphragm.

Embodiment 107

The method of any of Embodiments 101 to 106, wherein the MEMS further includes a vent structure for dynamic pressure measurement.

Embodiment 108

The method of any of Embodiments 101 to 107, wherein the MEMS further includes a dielectric gap between the diaphragm and the handle.

Embodiment 109

The method of any of Embodiments 101 to 108, wherein the position of the diaphragm is obtained based on magnitude and/or phase shifts of the electromagnetic waves.

Embodiment 110

The method of any of Embodiments 101 to 109, wherein the sensor utilizes a combination of RF backscattering and radar to measure diaphragm displacement.

II. Sensor Modeling And Analysis

Acousto-Mechanical Lumped Element Model

Figure 13:
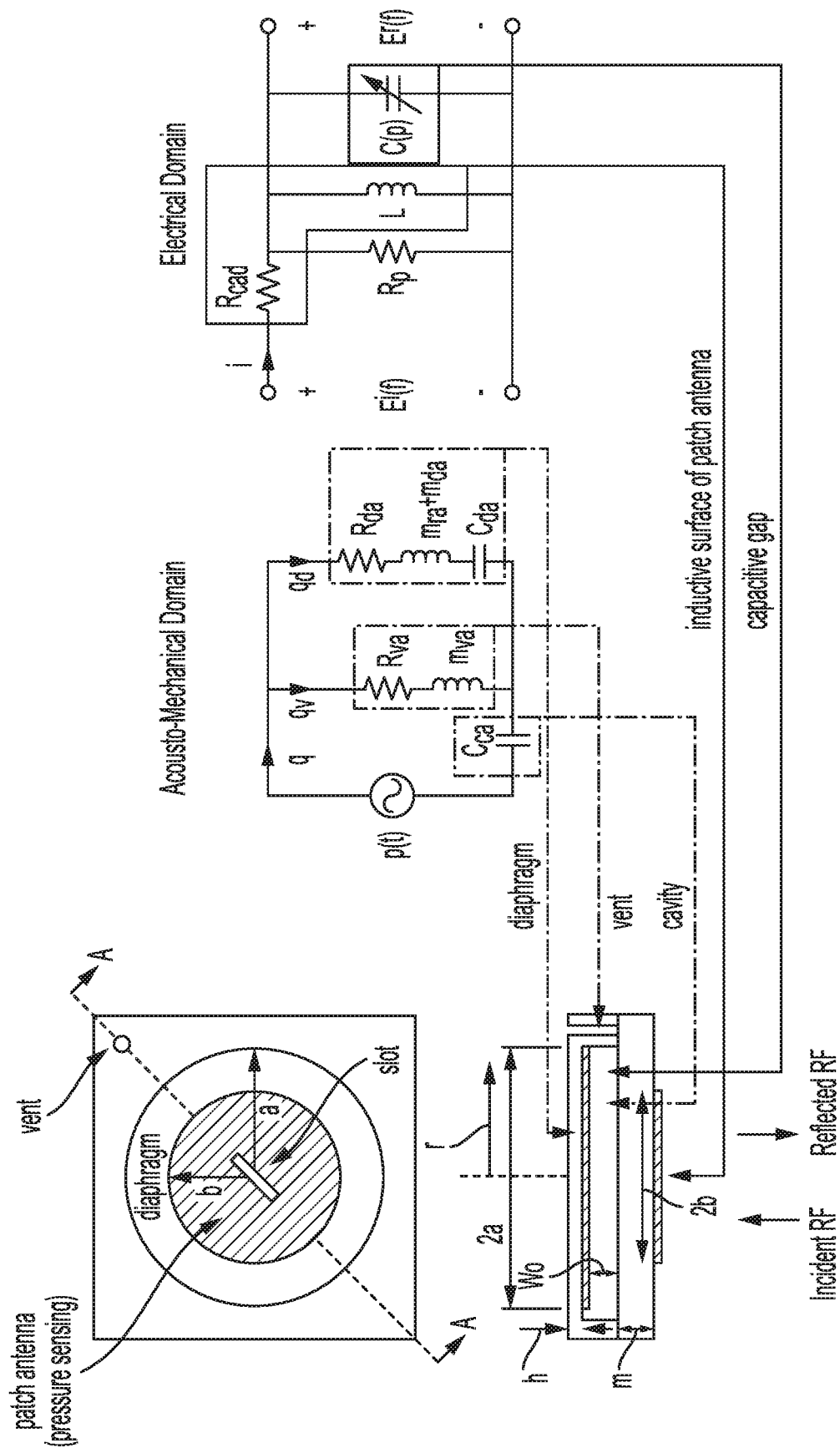
FIG. 13 shows bottom and cross-sectional views of an unloaded passive wireless dynamic pressure sensor according to an embodiment of the present invention with lumped element models of acousto-mechanical and electrical domains.

The acousto-mechanical portion of the dynamic pressure sensor can be modeled as a lumped element model (LEM) just beyond the first mechanical resonance. The acoustomechanical LEM assumes there is no relationship between spatial variations (e.g., displacement along diaphragm) and temporal variations (i.e., time). In the mechanical domain elements are treated as a point load at a single location, whereas in the acoustic domain elements are treated as an integrated load across some area. The acousto-mechanical LEM of the dynamic pressure sensor is shown in FIG. 13.

The fractional change in the electrical resonant frequency of the dynamic pressure sensor due to temperature is $$\frac{f_o(T)}{f_o} = \frac{1}{1+\alpha\Delta T} \cdot \frac{1}{\sqrt{1+\gamma\Delta T}}, \tag{1}$$

where $\alpha$ is the coefficient of thermal expansion (CTE) of the slot antenna, $\gamma$ is the thermal coefficient of dielectric constant of the handle, and $\Delta T$ is the change in temperature from room temperature.

The dynamic pressure sensor transduces an applied pressure p to the diaphragm into a displacement w(p). The quasi-static displacement of a uniformly loaded circular diaphragm is $$\omega(p, r) = \frac{pa^4}{64D}\left[1 - \left(\frac{r}{a}\right)^2\right]^2, \tag{2}$$

where p is the applied pressure, a is the radius of the diaphragm, D is the flexural rigidity of the diaphragm, and r is the radial distance from the center of the diaphragm. The maximum deflection of the diaphragm at the center where r=0 is $\omega_{pk}=pa^4/64D$.

The flexural rigidity of the diaphragm is related to the Young's modulus E, the thickness h, and the Poisson's ratio v of the diaphragm as $D=Eh^3/12(1-v^2)$. The acoustic compliance of the diaphragm is the ratio of the displaced volume of the circular diaphragm $\Delta V$ to the uniformly loaded applied pressure or $$C_{da} = \frac{\Delta V}{p} = \frac{1}{p}\int_0^a 2\pi r\omega(r)dr = \frac{\pi a^6}{192\,D}. \tag{3}$$

The mechanical sensitivity of the diaphragm $S_m$ is equivalent to the acoustic compliance of the diaphragm $C_{da}$. The acoustic mass of the circular diaphragm is determined by equating the lumped kinetic energy of the diaphragm to the total kinetic energy such that $$m_{da} = 2\pi \int_0^a \rho_A \left(\frac{\omega(r)}{\Delta V}\right)^2 rdr = \frac{9\rho_A}{5\pi a^2}, \tag{4}$$

where $\rho A$ is the area density of the diaphragm.

The radiation mass is an additional mass term caused by fluid particles that oscillate with the diaphragm given as $$m_{ra} = \frac{8\rho_o}{3\pi^2 a}, \tag{5}$$

where $\rho o$ is the density of the fluidic medium (e.g., air).

The quality factor of the diaphragm related to air damping $Q_{air}$, thermoelastic damping $Q_{therm}$, support losses $Q_{sup}$, and surface losses $Q_{surf}$ is given as $Q^{-1}=Q_{air}^{-1}+Q_{therm}^{-1}+Q_{sup}^{-1}+Q_{surf}^{-1}$.

The damping ratio $\xi=\frac{1}{2}Q$ is experimentally determined due to the difficulty in isolating the many forms of damping. The acoustic resistance associated with damping of the diaphragm is $$R_{da} = 2\zeta\sqrt{\frac{m_{ra}+m_{da}}{C_{da}}}. \tag{6}$$

The acoustic compliance of the cavity is $$C_{ca} = \frac{V}{\rho_o c_o^2}, \tag{7}$$

where V is the volume of the cavity and $c_o$ is the isoentropic speed of sound.

The acoustic compliance of the cavity is inherently low for MEMS, resulting in an effect known as cavity stiffening. The effect of cavity stiffening is sensitivity loss. The acoustomechanical sensitivity of the dynamic pressure sensor due to cavity stiffening is $$S_{am} = \frac{d\omega}{dp} \cdot \frac{C_{ca}}{C_{da}}. \tag{8}$$

The acoustic mass of the cavity is $$m_{ca} = \frac{\rho_o z}{3\pi a^2}. \tag{9}$$

The acoustic resistance of the vent structure for a rectangular cross-section is $$R_{va} = \frac{12\mu L_{eff}}{\omega_o d_o^3}, \tag{10}$$

where $\mu$ is the dynamic viscosity of the fluidic medium (e.g., air), $L_{eff}$ is the effective length of the vent, $w_v$ is the width of the vent channel, and is the depth of the vent channel.

The acoustic bandwidth of the dynamic pressure sensor is related to the cut-off frequency $f_{a,o} \propto 1/\sqrt{C_{ca}}$ and cut-on frequency $f_{a,co} \propto 1/R_{va}$ of the pressure sensor as $\Delta f_a = f_{a,o} - f_{a,co}$.

Electrical Lumped Element Model

The electrical portion of the dynamic pressure sensor can be modeled as a LEM under the assumption that the diameter of the patch antenna 2b is much less than the electrical operating wavelength $\lambda=c/f\sqrt{\varepsilon_{eff}}$. The radius of a circular patch antenna is related to the electrical operating wavelength as $b=1.841\lambda/2\pi$, which makes it physically unrealizable to fulfill the assumption that $2b \ll \lambda$. The transmission line and cavity models were developed to represent microstrip antennas. The transmission line model is a distributed element model with an input impedance that varies with the width of the patch Was tan βW, whereas the cavity model is a LEM assuming the patch antenna behaves like a narrow-band resonator (i.e., lossy cavity). The cavity model has boundary conditions such that an incident electric field on the surface of the patch is constrained to $\hat{z} \times [\vec{E}^r + \vec{E}^i] = Z_s[\hat{z} \times \vec{J}_s]$ and is considered appropriate for describing the scattering behavior of a patch antenna. The electrical LEM of the dynamic pressure sensor is shown in FIG. 13.

The input impedance of the first resonant mode of the cavity is described as a parallel RLC circuit with $$Z_{in} = \left(\frac{1}{R} + j\omega C + \frac{1}{j\omega L}\right)^{-1}.$$

The nominal capacitance between the slot antenna and ground plane for an unloaded diaphragm is related to the capacitance of the handle $C_1 = \varepsilon_o \varepsilon_r A/m$ and the air gap capacitance $C_2 = \varepsilon_o A/\omega_o$ as $C_o = C_1 \| C_2$. The nominal capacitance for an unloaded diaphragm is expanded to $$C_o = \frac{\varepsilon_o \varepsilon_{eff} A}{d} = \frac{\varepsilon_o A}{d} \cdot \left[\frac{\varepsilon_r}{1 + \varepsilon_r \frac{w_o}{m}} \cdot \left(1 + \frac{w_o}{m}\right)\right], \quad (11)$$

where εo is the permittivity of free-space, A is the area of the circular patch antenna, $d = w_o + m$ is the nominal distance between the antenna and ground plane, $\varepsilon_r$ is the relative permittivity of the handle, $w_o$ is the nominal air gap between the ground plane and the handle, and m is the handle thickness.

The area of the circular patch antenna $A = \pi b^2$ does not account for fringe effects along the periphery of the antenna. The effective antenna radius accounting for the fringe fields is $$b_e = b\sqrt{1 + \frac{2d}{\pi b \varepsilon_{eff}}\left\{\ln\frac{\pi b}{2d} + 1.7726\right\}}, \quad (12)$$

where $\varepsilon_{eff}$ is the effective permittivity of the antenna.

The nominal electrical resonant frequency is related to the nominal capacitance $C_0$ and the inductance $L_o$ as $f_o = 1/2\pi \sqrt{L_o C_o}$. The electrical resonant frequency is also related to the electrical operating wavelength as $f_o = c/\lambda\sqrt{\varepsilon_{eff}}$. The inductance of the circular patch antenna is derived as $$L_o = \frac{\lambda^2 \varepsilon_{eff}}{4\pi^2 c^2 C_o} = \frac{\mu_o d}{\pi(1.841)^2}, \quad (13)$$

where $\mu_0$ is the magnetic permeability of free-space.

The capacitance between the slot antenna and ground plane for a uniformly applied load is $$C(p) = \frac{\varepsilon_o \varepsilon_r}{m} \int_0^{2\pi}\int_0^b \frac{r}{1 + \varepsilon_r \frac{g}{m}} dr d\theta, \quad (14)$$

where $g = w_o - w(p, r)$ is the displaced air gap due to loading.

The electrical quality factor $Q_e$ is related to the radiation quality factor $Q_r$, surface wave quality factor $Q_{sw}$, dielectric quality factor $Q_d$, and conductor quality factor $Q_c$ as $Q_e^{-1} = Q_r^{-1} + Q_{sw}^{-1} + Q_d^{-1} + Q_c^{-1}$. The losses associated with surface waves, dielectric, and conductor are generally low compared to the radiation losses such that $Q_e \approx Q_r$. The electrical quality factor for the dynamic pressure sensor is then $$Q_e = \frac{1.841 \pi b R_{rad} \sqrt{\varepsilon_{eff}}}{d Z_o} \quad (15)$$

where $R_{rad}$ is the radiation resistance of the antenna and $Z_o$ is the impedance of free-space.

The expression in (15) agrees with Balanis' assessment of microstrip patch antennas using a volumetric relationship that determined $Q \propto \sqrt{\varepsilon_{eff}}$. The electrical sensitivity of the dynamic pressure sensor is $$S_e = \frac{df_o}{dw} = \frac{d}{dw}\left(\frac{c}{\lambda\sqrt{\varepsilon_{eff}}}\right). \quad (16)$$

The sensitivity of the dynamic pressure sensor relates the acousto-mechanical and electrical sensitivities as $$S = S_{am} \cdot S_e = \frac{df_o}{dp}. \quad (17)$$

The dynamic range of the dynamic pressure sensor is $$DR = 20\log_{10}\left|\frac{p_{max}}{p_{min}}\right|, \quad (18)$$

where $p_{max}$ is the maximum pressure to the sensor that yields a linear response and $p_{min}$ is the minimum detectable pressure.

The antenna reflection coefficient for the circular patch antenna describes a band-pass response of the RCS as $$\Gamma_a = \frac{R_p/R_{rad}}{1 + \frac{R_p}{R_{rad}} + j\omega R_p C + \frac{R_p}{j\omega L}}, \quad (19)$$

where $R_p$ is the parallel resistance of the antenna.

The antenna reflection coefficient is bounded such that $0 \le |\Gamma_a| \le 1$ and at electrical resonance reduces to $\Gamma_a = R_p/(R_{rad} + R_p)$. The structural mode RCS of the antenna also contributes to the scattered power. The structural mode RCS of the circular patch antenna in the optical region (i.e., $L \gg \lambda$) is $\sigma_s = 4\pi^3 b^4/\lambda^2$. The structural mode RCS below the optical region can be more accurately determined using a numerically determined correction factor F. For simplification, the structural reflection coefficient for the circular patch antenna in the far-field is $$\Gamma_s = \frac{R_B}{R_A + R_B} \propto \sqrt{\sigma}_s, \quad (20)$$

where $R_A$ and $R_B$ are chosen to correspond to the numerically determined structural RCS of the antenna.

The insertion loss relating the power received to the power transmitted at the frontend of the electromagnetic waveguide due to the sensor affixed to the backend of the electromagnetic waveguide is $$IL = 10\log_{10}\left|\frac{p_r}{p_t}\right| = 10\log_{10}|\eta_1\eta_2\Gamma_s^2\Gamma_a^2|, \quad (21)$$

where $\eta_1 = e^{-2al}$ and $\eta_2 = e^{-2al}$ are the transmit and receive path power losses in the electromagnetic waveguide.

Sensor Polarization

A circular patch antenna intrinsically has scattering behavior identical to the incident electromagnetic wave. The effect of an incident linearly polarized E-field, for example, is a scattered linearly polarized E-field. The issue with observing the scattered E-field in the same direction as the incident E-field is there is a decrease in contrast between the background and the sensor. The addition of a slot to a circular patch antenna will induce circular polarization in the antenna. Circular polarization allows observation of the incident E-field in a perpendicular direction to the incident E-field, which increases contrast between the sensor and the background.

The scattering parameters relate some incident E-field $E_j^i$ to a resultant scattered E-field $E_i^r$ as $a_{ij} = E_i^r/E_j^i$ with magnitude and phase $a_{ij} = |a_{ij}|e^{j\Theta_{ij}}$. The far-field RCS is related to the scattering parameters as $$\sigma_{ij} = \lim_{R\to\infty} 4\pi R^2 |a_{ij}|^2. \quad (22)$$

The far-field RCS in vertical (v) and horizontal (h) directions are related to the scattered and incident E-fields as $$\begin{Bmatrix} E_v^r \\ E_h^r \end{Bmatrix} = \frac{1}{\sqrt{4\pi}\,R}\begin{pmatrix} \sigma_{vv} & \sigma_{vh} \\ \sigma_{hv} & \sigma_{hh} \end{pmatrix}\begin{Bmatrix} E_v^i \\ E_h^i \end{Bmatrix}. \quad (23)$$

A circular patch antenna is intrinsically reciprocal and therefore has equivalent cross-polarization RCS parameters (i.e., $\sigma_{hv} = \sigma_{vh}$). Furthermore, a circularly polarized patch antenna has equivalent RCS parameters in both axes (e.g., $\sigma_{vv} = \sigma_{hv}$). The composite scattered E-field in phasor form with vertical and horizontal components is $$E^r(t) = \hat{h}E_h^r e^{j\omega t} + \hat{v}E_v^r e^{j(\omega t + \delta)}, \quad (24)$$

where $\delta$ is the phase difference between the E-fields.

A circularly polarized electromagnetic wave has equal power in both the horizontal and vertical directions and an axial ratio of $A_R = 1$. It is quite difficult in practice to achieve circular polarization. It is typically the case that an axial ratio of $A_R > 1$ is attainable such that the polarization is slightly elliptical.

III. Exemplary Applications

Several prototypes including a demonstration pressure sensor with a silicon diaphragm and a high temperature pressure sensor with a sapphire diaphragm were constructed to prove the concepts of certain embodiments of the present invention. Although certain parameters (including dimensions) and materials are discussed in the following examples, they are not to be construed as limiting embodiments of the present invention, as many of the parameters were chosen to accommodate commercially available parts. In practice, embodiments of the present invention can be custom fabricated to achieve precise performance characteristics and alternative configurations.

A greater understanding of the embodiments of the present invention and of its many advantages may be had from the following examples, given by way of illustration. The following examples are illustrative of some of the methods, applications, embodiments and variants of the present invention. They are, of course, not to be considered as limiting the invention. Numerous changes and modifications can be made with respect to the embodiments of the invention.

Example 1

In FIG. 1, the antenna radius b can be between 2 and 4 mm such that the antenna is large enough to resonate in the X-band, but small enough to allow 1 mm between the diaphragm and the edge of a 10 mm×10 mm die. The diaphragm thickness h is preferably between 15 and 50 µm to support a nominal air gap depth or a cavity depth of up to 35 µm. The diaphragm thickness for the sapphire-based high temperature pressure sensor was fixed at 50 µm as a commercially available part. The electrical operating frequency f was bounded between 13 and 16 GHz such that the antenna operated within its dynamic range, around 15 GHz.

Example 2

Optimization of the diaphragm was performed using commercially available software. The demonstration sensor was designed such that two diaphragm sizes (e.g., 7.6 mm and 6.4 mm) satisfy corresponding pressure requirements (e.g., 3 kPa and 6 kPa) for a pre-determined maximum displacement of 13.5 µm. The optimized design parameters for the demonstration sensor are given in Table I.

TABLE I

Summary of optimization results for demonstration sensor.

| Parameter | Variable | $P_{max}$ = 3 kPa | $P_{max}$ = 6 kPa |
|---|---|---|---|
| Diaphragm Diameter | 2a | 7.6 mm | 6.4 mm |
| Diaphragm Thickness | h | 35 µm | 35 µm |
| Cavity Depth | $w_a$ | 15 µm | 15 µm |
| Maximum Displacement | $w_{pk,nl}$ | 13.5 µm | 13.5 µm |
| Antenna Diameter | 2b | 5.8 mm | 5.8 mm |
| Nom. Operating Frequency | $f_o$ | 14.9 GHz | 14.9 GHz |

Example 3

FIGS. 14 through 19 show data (in graphical form) from simulations that were conducted assuming the use of a 5.7 mm circular patch antenna. This information can be used to optimize sensors of the embodiments of the present invention for particular applications.

Figure 14:
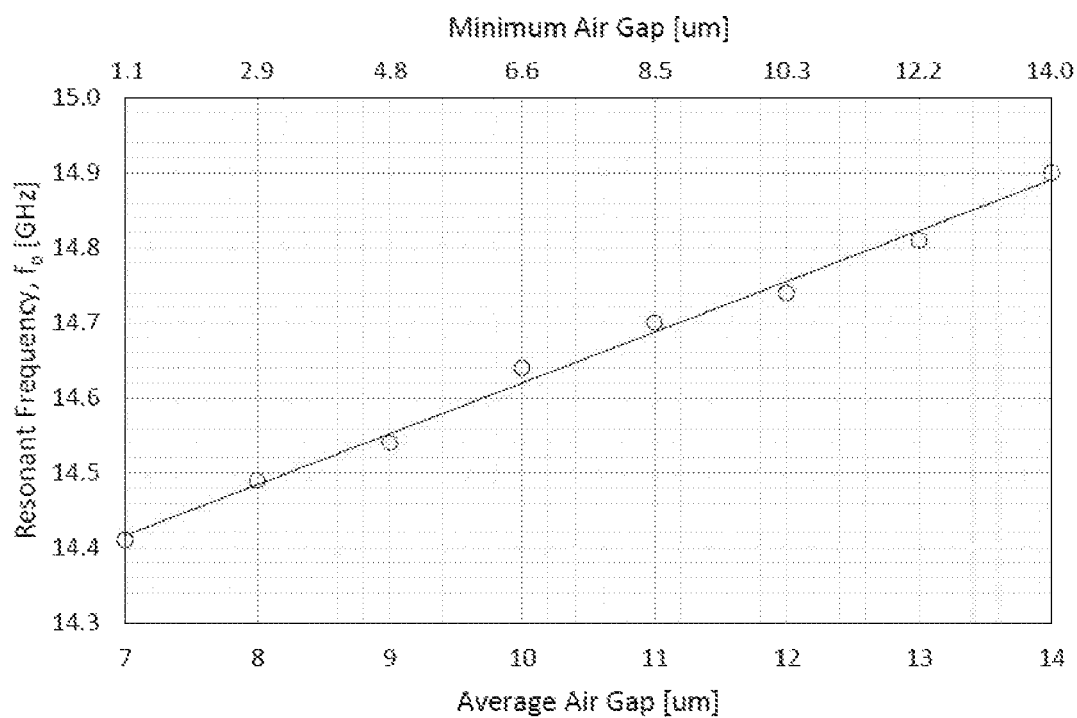
FIG. 14 shows a simulation graph of resonant frequency as a function of antenna air gap for a 5.7 mm circular patch antenna.

FIG. 14 shows the predicted (or simulated) resonant frequency of a pressure sensor as a function of the average air gap (nominal or deflected) depth. It can be seen that there is a linear relationship between the resonant frequency and the average air gap depth, which makes it easier to extract the sensed pressure since the pressure is linearly related to the gap depth, as shown in equation (2).

Figure 15:
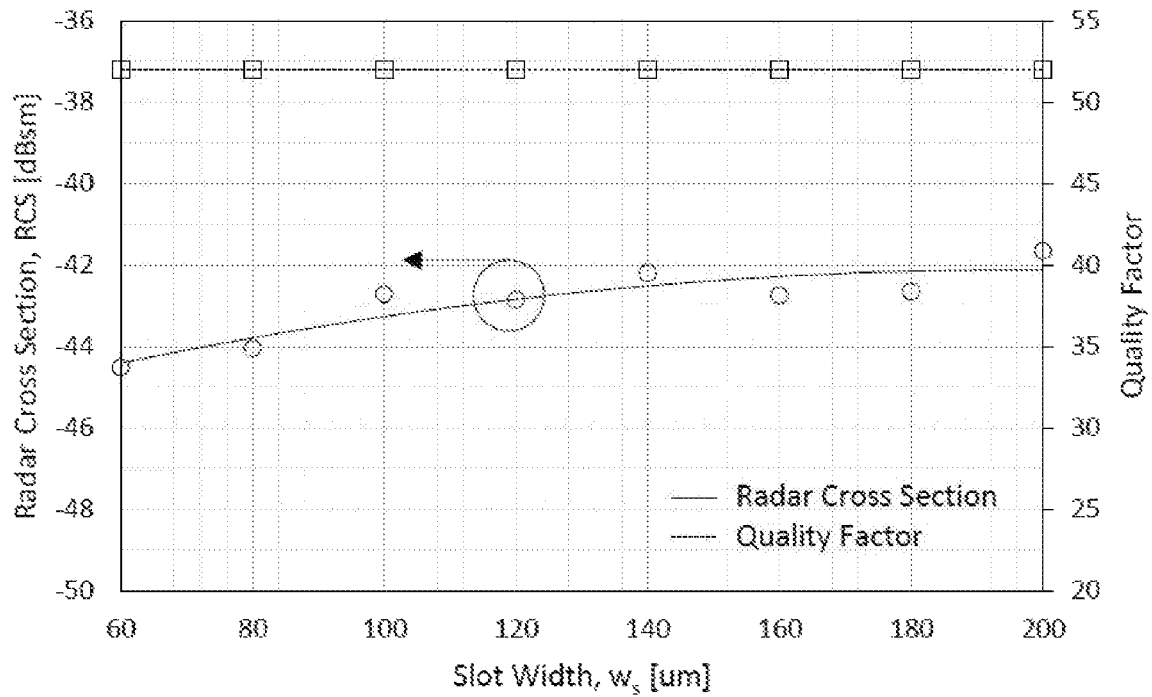
FIG. 15 shows a simulation graph of radar cross section (RCS) and quality factor as a function of slot width for a 5.7 mm circular patch antenna.
Figure 16:
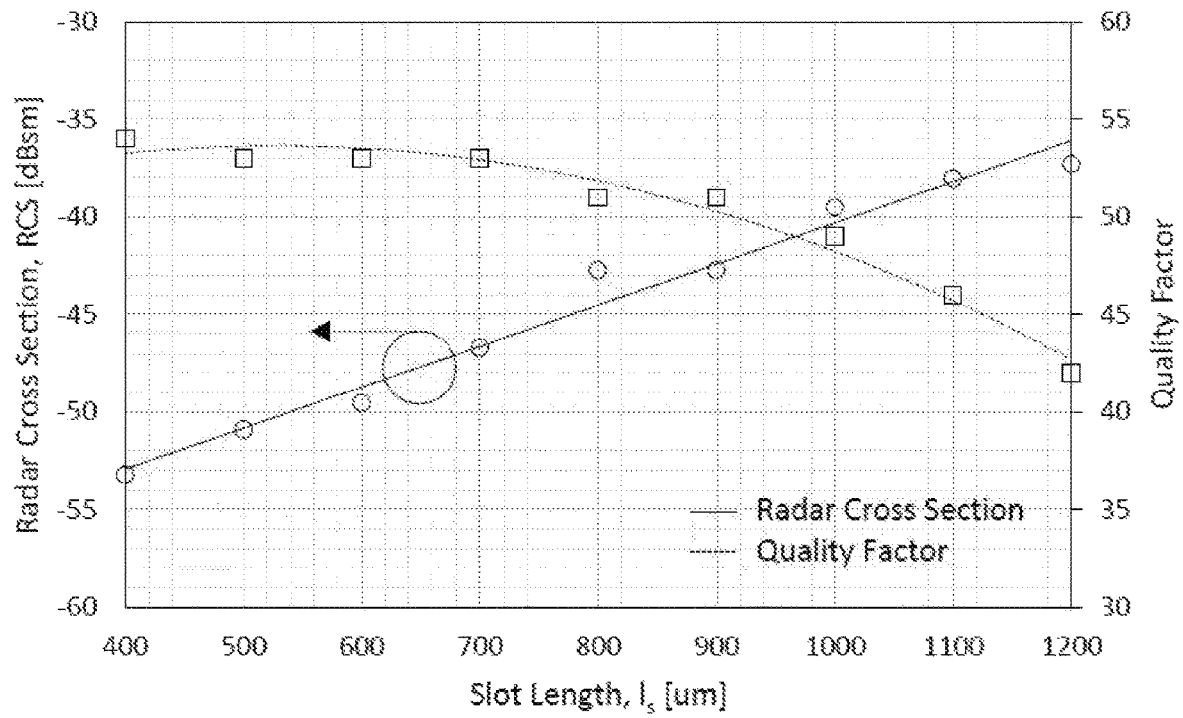
FIG. 16 shows a simulation graph of RCS and quality factor as a function of slot length for a 5.7 mm circular patch antenna.

FIG. 15 shows the predicted (or simulated) RCS and quality factor (Q factor) as a function of the slot width. The slot width can be selected to obtain the highest RCS (for better sensing) and the highest Q factor (for better sensitivity). The electrical sensitivity of the pressure sensor, as shown in equation (16), is directly proportional to the Q factor (i.e., high Q yields high sensitivity). The RCS is important as it is directly related to the insertion loss from the transmitter to the receiver (i.e., high RCS yields low insertion loss). FIG. 16 shows the RCS and Q factor as a function of the slot length. The slot length can also be selected to obtain the highest RCS and highest Q factor.

Figure 17:
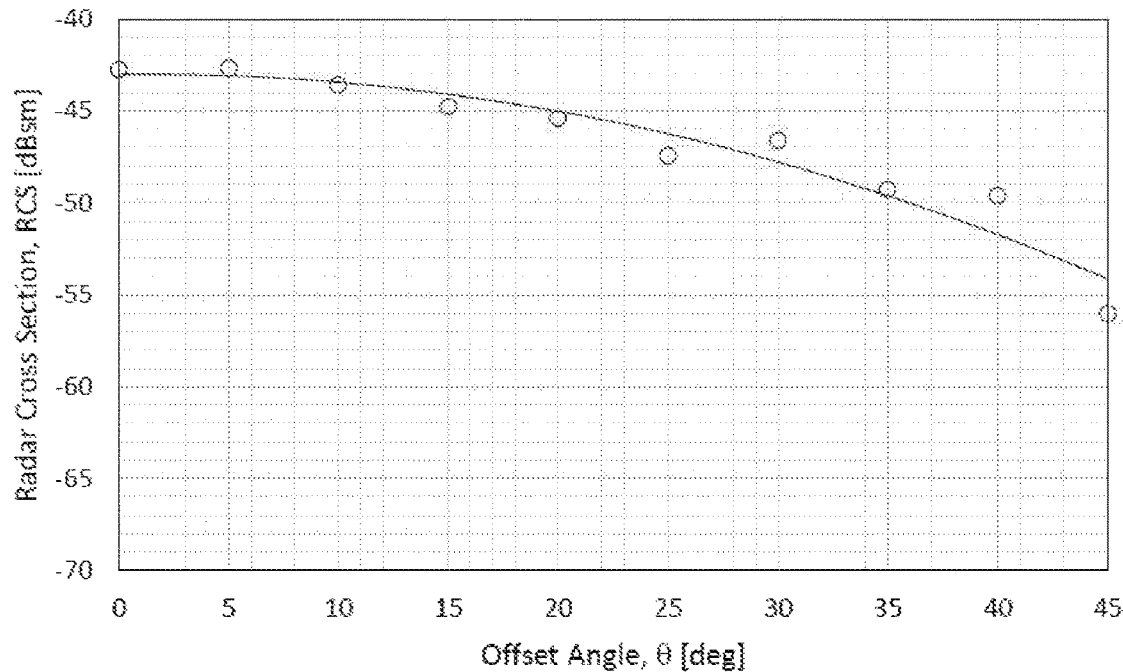
FIG. 17 shows a simulation graph of RCS as a function of offset angle for a 5.7 mm circular patch antenna.

FIG. 17 shows the predicted (or simulated) RCS as a function of the some offset angle (or misalignment) with the sensor/patch antenna. It shows that for small misalignments (up to 15 deg) there is minimal change in the RCS. This is an important feature of the pressure sensor in comparison to optical sensors that require precision alignment for good signal reflections.

Figure 18:
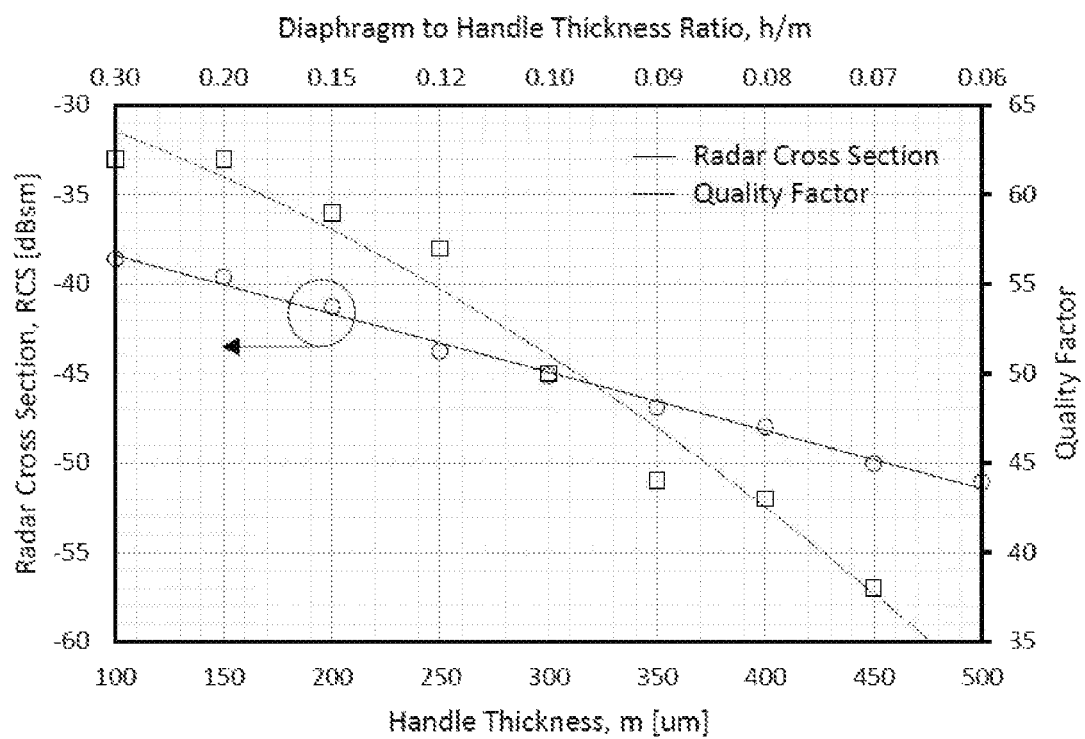
FIG. 18 shows a simulation of RCS and quality factor as a function of handle thickness for a 5.7 mm circular patch antenna.

FIG. 18 shows the predicted (or simulated) RCS and Q factor as a function of the handle thickness. It shows that, from an electrical standpoint, it is desirable to operate with a low handle thickness. However, if the handle is too thin (i.e., handle thickness approaches diaphragm thickness), then the handle will also begin to deflect under an applied pressure; the result is a decrease in sensitivity.

As shown in the fabrication process of FIG. 6, the first process step is to define an air gap (or cavity) and vent channel by etching a depth of 15 µm in the device layer of the SOI using deep reactive ion etching (DRIE). The second process step is to sputter deposit 1 µm of aluminum on the device layer then pattern the aluminum by wet etching to define the ground plane in the cavity. The third process step is to define the vent hole by etching through the device layer using DRIE. In addition to defining the vent hole, the perimeter of the die is also defined in the third process step. The fourth process step is to remove the backside silicon of the SOI using DRIE. The oxide is subsequently removed by RIE etching to open the vent hole and release the sensor die. The fifth processing step is to attach the sensor die to a Borofloat® 33 handle die using an adhesive. The Borofloat® 33 handle has 500 nm of patterned aluminum to define the antenna and is separated using a dicing saw. The antenna diameters are 5.6, 5.7, and 5.8 mm, respectively.

Figure 20:
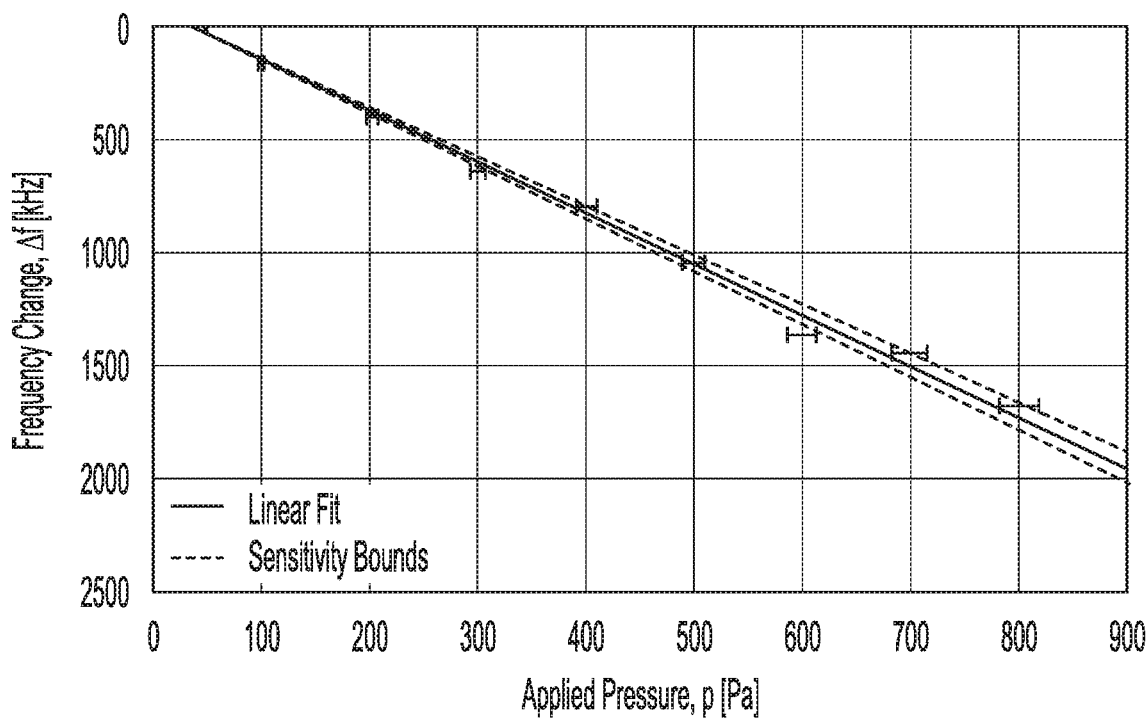
FIG. 20 shows the change in the electrical resonant frequency as a function of the applied pressure at 1 kHz for a dynamic pressure sensor with a 5.6 mm circular patch antenna.

Both the static and dynamic proof-of-concept pressure sensors with 5.6, 5.7, and 5.8 mm antenna diameters are characterized to validate the ability to measure static pressure and dynamic pressure, respectively. The measured data is summarized in Table II. Additionally, the change in the electrical resonant frequency as a function of the applied pressure at 1 kHz for a dynamic pressure sensor with a 5.6 mm antenna diameter is shown in FIG. 20.

TABLE II

Summary of Measured Proof-Of-Concept Pressure Sensors

| Pressure Type | Antenna Diameter | Resonant Frequency (GHz) | | | Sensitivity (kHz/Pa) | | Dynamic Range |
|---|---|---|---|---|---|---|---|
| | | Measured | Numerical | Error | Measured | Analytical | |
| Static | 5.6 mm | 15.120 | 15.379 | 1.68% | 3.42 +/− 0.08 | 12.4 +/− 0.7 | 40.8 dB |
| | 5.7 mm | 14.784 | 15.116 | 2.20% | 3.13 +/− 0.07 | 11.9 +/− 0.7 | 40.1 dB |
| | 5.8 mm | 14.496 | 14.862 | 2.46% | 2.52 +/− 0.06 | 11.5 +/− 0.6 | 38.2 dB |
| Dynamic | 5.6 mm | 15.344 | 15.379 | 0.23% | 2.25 +/− 0.09 | 12.4 +/− 0.7 | 37.2 dB |
| | 5.7 mm | 15.104 | 15.116 | 0.08% | 2.22 +/− 0.08 | 11.9 +/− 0.7 | 37.1 dB |
| | 5.8 mm | 15.056 | 14.862 | 1.31% | 5.10 +/− 0.16 | 11.5 +/− 0.6 | 44.3 dB |

Figure 19:
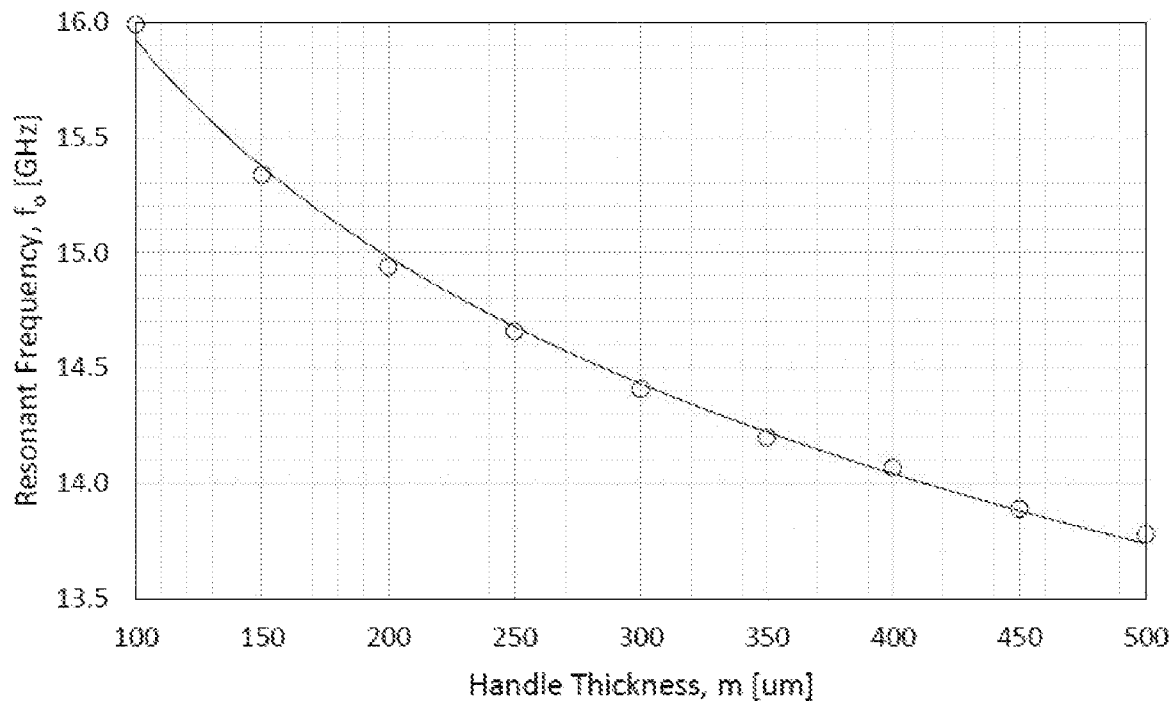
FIG. 19 shows a simulation graph resonant frequency as a function of handle thickness for a 5.7 mm circular patch antenna.

FIG. 19 shows the predicted (or simulated) resonant frequency as a function of the handle thickness. The purpose here is to show if there is any tolerances (i.e., +/−X percent) with a handle provided by a manufacturer. FIG. 19 shows that a thinner handle with such tolerances will result in higher uncertainty in the actual resonant frequency of the sensor than for a sensor with a thicker handle.

Example 4

A set of proof-of-concept static and dynamic pressure sensors are fabricated to validate the ability to do passive wireless pressure sensing. The proof-of-concept pressure sensors are fabricated with silicon due to its low-cost, mature machinability, and good mechanical properties for MEMS. Borofloat® 33 is selected for the handle of the proof-of-concept pressure sensors due to its low-cost and compatibility with microfabrication processes. A silicon-on-insulator (SOI) wafer with a 475 µm thick silicon backside, 0.5 µm thick oxide, and 50 µm thick device layer and a 270 µm thick Borofloat® 33 wafer are used for fabrication of the proof-of-concept pressure sensors. The proof-of-concept pressure sensors are fabricated at the University of Florida's Nanoscale Research Facility (NRF) in a class 100 clean room using common microfabrication processes. The proof-of-concept pressure sensors have a silicon diaphragm and Borofloat® 33 handle.

Example 5

A high-temperature pressure sensor is constructed of materials that are able to operate at temperatures in excess of 1000° C. The diaphragm, handle, and structural body, for example, are constructed of sapphire and the capacitive element including the antenna and ground plane are constructed of platinum. A set of 10 mm×10 mm A-plane sapphire die with 50 µm and 200 µm thicknesses are selected for fabrication of the high-temperature pressure sensor's diaphragm and handle, respectively. Laser machining of sapphire has been successfully accomplished; however, laser machining can be cost prohibitive as well as time consuming. The fabrication process as shown in FIG. 9 is used.

The first processing step is to define a ground plane on the diaphragm and an antenna on the handle by sputter depositing and patterning 300 nm of chrome for a lift-off process. Next, 10 nm of titanium followed by 150 nm of platinum are sputter deposited. The antenna and ground plane are then defined by performing a lift-off. The second processing step is to define the cavity and vent channel by sputter depositing and patterning 2.5 µm of titanium. The third processing step is to attach the two sapphire die using an alumina adhesive.

Figure 21:
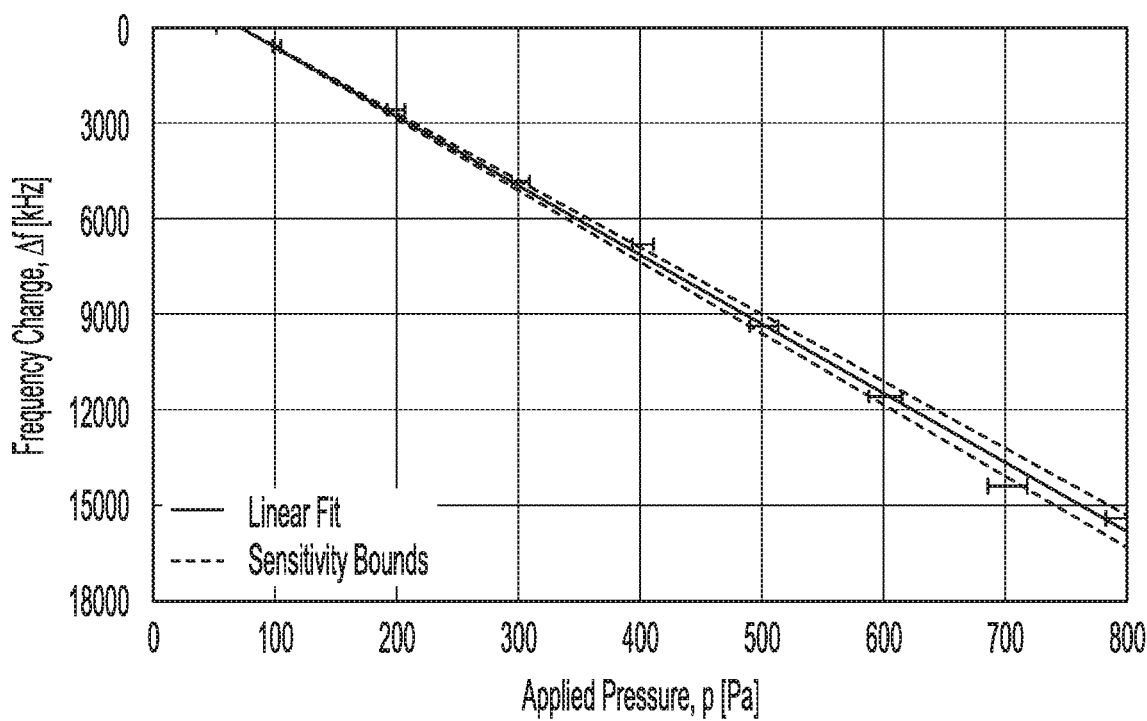
FIG. 21 shows the change in the electrical resonant frequency as a function of the applied pressure at 1 kHz for a high-temperature dynamic pressure sensor with a 3.8 mm circular patch antenna.

The high-temperature dynamic pressure sensor is characterized. The average change in the electrical resonant frequency for the high-temperature pressure sensor is 92 kHz, which corresponds to a minimum detectable frequency of 130 kHz. The nominal electrical resonant frequency of the high-temperature dynamic pressure sensor with a 3.8 mm antenna diameter is measured as 14.784 GHz. The change in the electrical resonant frequency as a function of the applied pressure at 1 kHz for the high-temperature dynamic pressure sensor is shown in FIG. 21. The measured sensitivity of the high-temperature pressure sensor is measured as 21.7 kHz/Pa, which matches well with the analytical model predicting 23.7 kHz/Pa.

Figure 22:
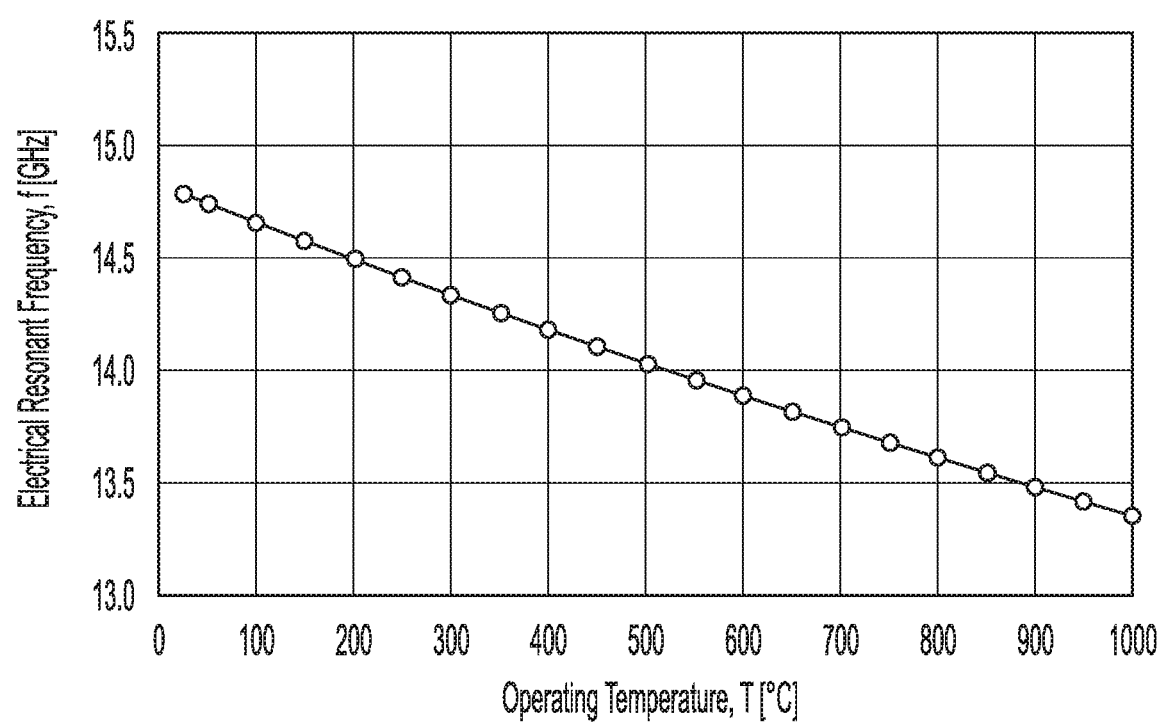
FIG. 22 shows the predicted electrical resonant frequency as a function of temperature for a high-temperature dynamic pressure sensor.

The electrical resonant frequency will change as a function of temperature as described in equation (1). The high-temperature pressure sensor has a platinum-based antenna and ground plane with a CTE of 9 ppm/° C. and a sapphire handle with a thermal coefficient of dielectric constant of 230 ppm/° C. The predicted electrical resonant frequency as a function of temperature is shown in FIG. 22 for temperatures up to 1000° C. The thermal transient response time due to a change in temperature will be much lower than the acousto-mechanical response time due to a change in pressure, which means any variation in frequency due to temperature can be compensated for in real time using a reference temperature sensor.

IV. Conclusion

It should be understood that the examples and embodiments described herein are for illustrative purposes only. Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A pressure sensor for harsh environments, the sensor comprising:
   a capacitive-type device comprising a diaphragm, a handle, a dielectric gap separating the diaphragm and the handle, and an antenna formed on the handle or the diaphragm, wherein the antenna is a planar antenna comprising a slot; and
   a waveguide operably connected to the capacitive-type device.

2. The sensor of claim 1, wherein the capacitive-type device further comprising a ground plane formed on the diaphragm or the handle.

3. The sensor of claim 2, wherein at least one of the ground plane, the antenna, or the waveguide is comprised of a high-temperature compatible electrically conductive material.

4. The sensor of claim 3, wherein the high-temperature compatible electrically conductive material is selected from the group consisting platinum, titanium, chromium, iridium, and tungsten.

5. The sensor of claim 1, wherein at least one of the diaphragm and the handle is comprised of a high-temperature compatible material.

6. The sensor of claim 5, wherein the high-temperature compatible material is selected from the group comprising sapphire, aluminum nitride, silicon carbide, silicon nitride, and diamond.

7. The sensor of claim 1, wherein the capacitive-type device further comprises a vent structure that acoustically connects the dielectric gap with the outside environment.

8. The sensor of claim 7, wherein the vent structure has a serpentine structure.

9. The sensor of claim 1, wherein the diameter of the diaphragm is between 0.5 and 20 mm.

10. The sensor of claim 1, wherein the diameter of the diaphragm is between 2 and 8 mm.

11. The sensor of claim 1, wherein the diameter of the antenna is between 0.5 and 20 mm.

12. The sensor of claim 1, wherein the diameter of the antenna is between 2 and 8 mm.

13. A sensor assembly comprising:
   one or more plates;
   a sensor comprising:
      a capacitive-type device comprising a diaphragm, a handle, and a dielectric gap separating the diaphragm and the handle, and
      a waveguide operably connected to the capacitive-type device via the one or more plates; and
   an electromagnetic wave producing and receiving device operatively attached to the waveguide.

14. The sensor assembly of claim 13, wherein:
   the one or more plates comprise two plates configured for securing the capacitive-type device of the sensor to the waveguide of the sensor such that the capacitive-type device is positioned intermediate the plates;
   at least one of the two plates has a recess to accommodate the capacitive-type device of the sensor; and
   each of the two plates has at least one opening, through one of which the capacitive-type device interacts with the environment where pressure is present, through the other of which the capacitive-type device interacts with the waveguide of the sensor.

15. The sensor assembly of claim 13, wherein the capacitive-type device is secured to a first end of the waveguide and the electromagnetic wave producing and receiving device is attached to a second end of the waveguide, wherein the second end of the waveguide is further away from the capacitive-type device than the first end of the waveguide.

16. A method for taking pressure measurements in harsh environments, the method comprising the steps of:
   providing a microelectromechanical system (MEMS) including a diaphragm, a handle, and a dielectric gap separating the diaphragm and the handle, wherein the MEMS is positioned between two planar plates;
   transmitting electromagnetic waves toward the MEMS;
   receiving the electromagnetic waves as they are reflected off the MEMS; and
   determining the position of the diaphragm using measurements obtained from the reflected electromagnetic waves.

17. The method of claim 16, further comprising the step of channeling or guiding the electromagnetic waves via a waveguide.

18. The method of claim 16, wherein the position of the diaphragm is determined, in part, based on at least one of a magnitude or phase shifts of the electromagnetic waves.

19. The method of claim 16, wherein the electromagnetic waves are radio frequency waves in a range of 1 GHz to 100 GHz.

20. The method of claim 19, wherein the range is 10 GHz to 20 GHz.

21. The method of claim 16, wherein:
one of the two planar plates comprises a first opening and the other of the two planar plates comprises a second opening; and
the method further comprises the step of simultaneously interacting with (a) via the first opening, a high-temperature environment adjacent the one of the two plates, and (b) via the second opening, an electromagnetic waveguide adjacent the other of the two plates.

\* \* \* \* \*